United States Patent
Morise et al.

(10) Patent No.: US 9,142,759 B2
(45) Date of Patent: Sep. 22, 2015

(54) MAGNETIC MEMORY DEVICE AND METHOD OF MAGNETIC DOMAIN WALL MOTION

(71) Applicant: KABUSHIKI KAISHA TOSHIBA, Minato-ku, Tokyo (JP)

(72) Inventors: Hirofumi Morise, Kanagawa-ken (JP); Hideaki Fukuzawa, Kanagawa-ken (JP); Akira Kikitsu, Kanagawa-ken (JP); Yoshiaki Fukuzumi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/310,152

(22) Filed: Jun. 20, 2014

(65) Prior Publication Data
US 2015/0055404 A1   Feb. 26, 2015

Related U.S. Application Data

(62) Division of application No. 13/282,605, filed on Oct. 27, 2011, now Pat. No. 8,792,271.

(30) Foreign Application Priority Data

Mar. 30, 2011 (JP) .................. 2011-076416

(51) Int. Cl.
*G11C 11/15* (2006.01)
*H01L 43/08* (2006.01)
(Continued)

(52) U.S. Cl.
CPC ............... *H01L 43/08* (2013.01); *G11C 11/16* (2013.01); *H01F 10/3236* (2013.01);
(Continued)

(58) Field of Classification Search
CPC ...................................... G11C 11/15

USPC ......... 365/48, 55, 62, 66, 74, 78, 80–93, 100, 365/130, 131, 148, 158, 157, 171–173, 209, 365/213, 225.5, 230.07, 232, 243.5; 257/295, 421, 422, 427, E21.665, 257/E27.006; 438/3; 977/933–935
See application file for complete search history.

(56) References Cited

U.S. PATENT DOCUMENTS 5,883,760 A * 3/1999 Yamada et al. .................. 360/76
6,236,538 B1 * 5/2001 Yamada et al. ............ 360/123.6
(Continued)

FOREIGN PATENT DOCUMENTS

| JP | 2007-513501 | 5/2007 |
| JP | 2007-324269 | 12/2007 |

OTHER PUBLICATIONS

Office Action of Notification of Reasons for Refusal for Japanese Patent Application No. 2011-076416 Dated Oct. 24, 2014, 10 pages.

*Primary Examiner* — Harry W Byrne
(74) *Attorney, Agent, or Firm* — Amin, Turocy & Watson, LLP

(57) ABSTRACT

A magnetic memory device comprises a first electrode, a second electrode, a laminated structure comprising plural first magnetic layers being provided between the first electrode and the second electrode, a second magnetic layer comprising different composition elements from that of the first magnetic layer and being provided between plural first magnetic layers, a piezoelectric body provided on a opposite side to a side where the first electrode is provided in the laminated structure, and a third electrode applying voltage to the piezoelectric body and provided on a different position from a position where the first electrode is provided in the piezoelectric body.

10 Claims, 29 Drawing Sheets

(51) Int. Cl.
*G11C 11/16* (2006.01)
*H01L 27/22* (2006.01)
*H01L 41/09* (2006.01)
*H01L 41/12* (2006.01)
*H01L 43/10* (2006.01)
*H01F 10/32* (2006.01)

(52) U.S. Cl.
CPC ......... *H01F 10/3295* (2013.01); *H01L 27/228* (2013.01); *H01L 41/0986* (2013.01); *H01L 41/12* (2013.01); *H01L 43/10* (2013.01); *H01F 10/325* (2013.01); *H01F 10/3254* (2013.01); *H01F 10/3286* (2013.01)

(56) References Cited

U.S. PATENT DOCUMENTS

| | | | |
|---|---|---|---|
| 6,834,005 | B1 | 12/2004 | Parkin |
| 7,282,755 | B2 | 10/2007 | Pakala et al. |
| 8,138,758 | B2 * | 3/2012 | Wunderlich et al. .......... 324/252 |
| 2008/0165576 | A1 | 7/2008 | Deligianni et al. |
| 2009/0016098 | A1 * | 1/2009 | Wunderlich et al. .......... 365/158 |
| 2011/0170339 | A1 * | 7/2011 | Wunderlich et al. .......... 365/158 |

* cited by examiner

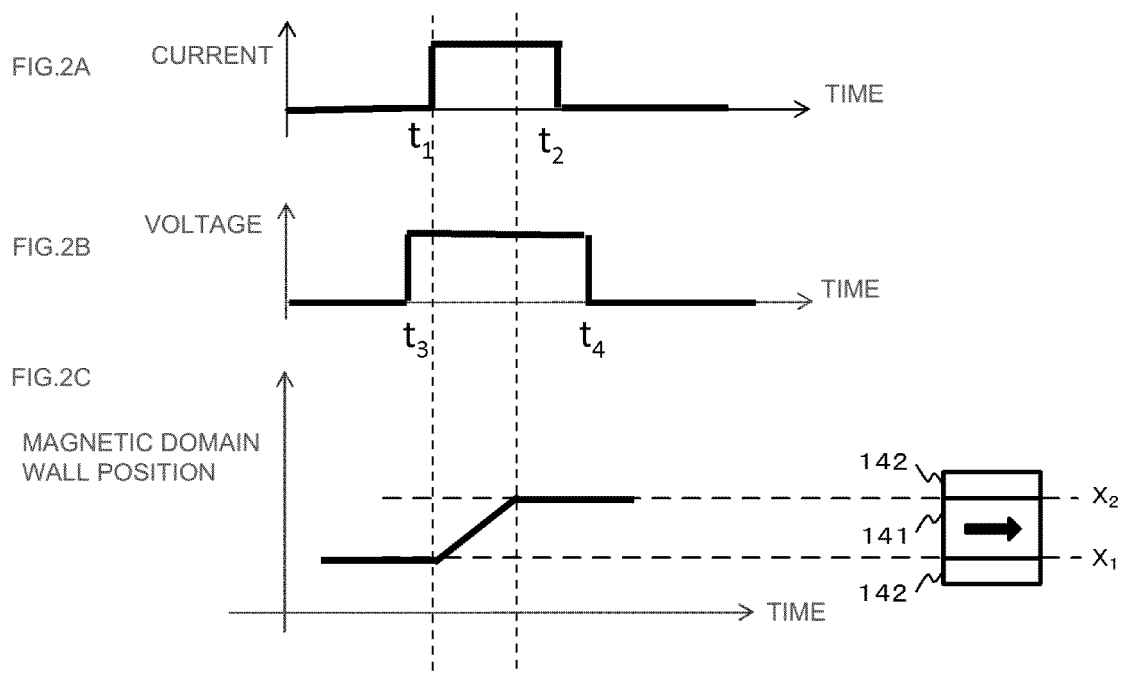

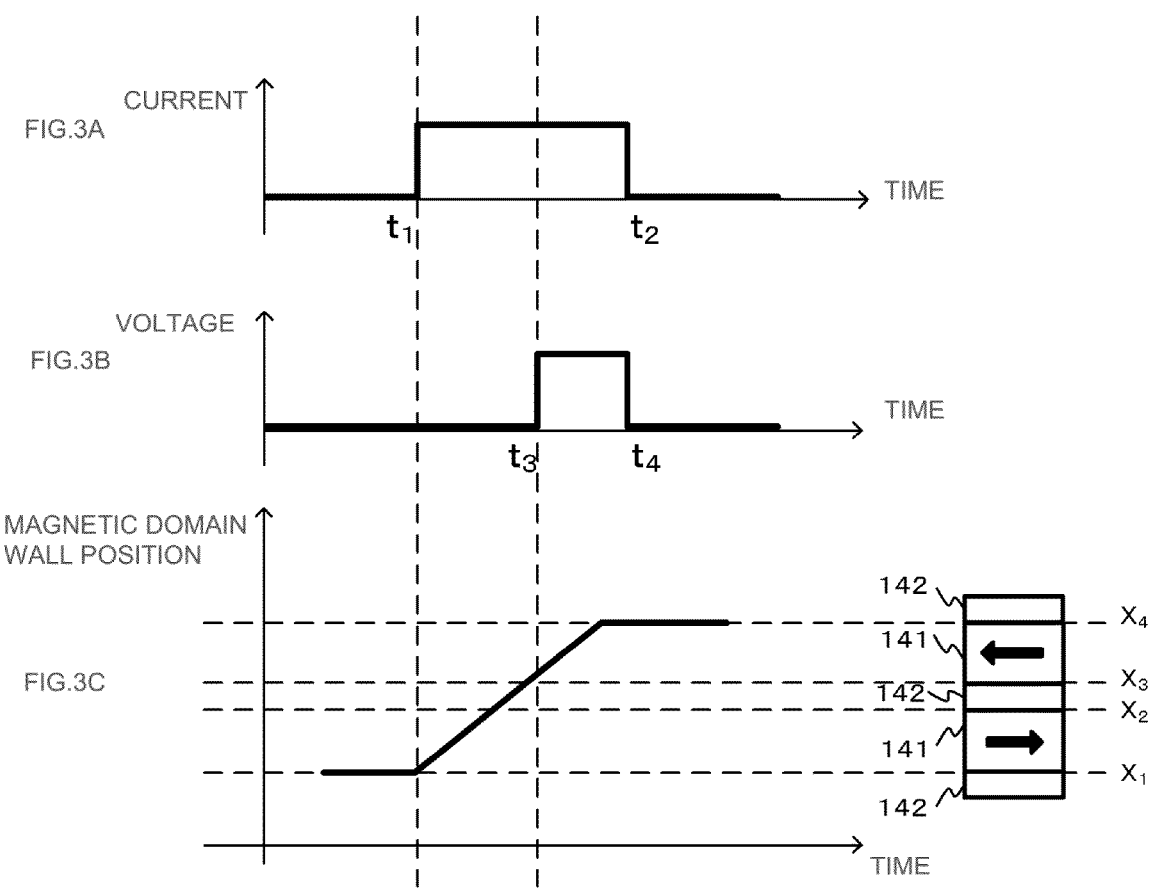

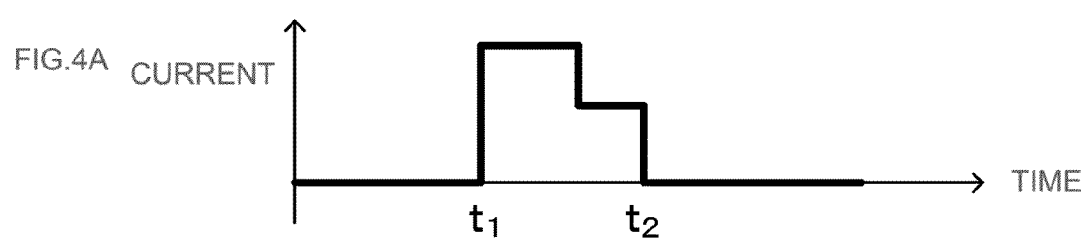
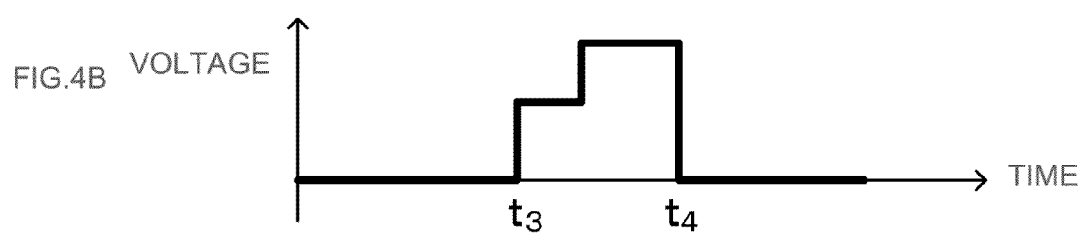

MAGNETIC MEMORY DEVICE AND METHOD OF MAGNETIC DOMAIN WALL MOTION

CROSS REFERENCE TO RELATED APPLICATIONS

This application is a Division of application Ser. No. 13/282,605 filed Oct. 27, 2011 the entire contents of which are incorporated herein by reference.

This application is based upon and claims the benefit of priority from the prior Japanese Patent Application No. 2011-076416, filed on Mar. 30, 2011 the entire contents of which are incorporated herein by reference.

FIELD

Embodiments described herein are related to a magnetic memory device, magnetic memory apparatus, and method of magnetic domain wall.

BACKGROUND

"A memory device, a selection device, and a wire which reads information" were fabricated in a semiconductor device. On the contrast, shift resistor type memory has been proposed for realizing a large capacity memory. This idea is based on arraying only the memory devices for realizing high density memory, and this idea is a method for transferring memory information to a sensor and a wire which are formed in given place. Thus, this idea enables memory capacity to increase markedly. The shift resister memory which is equipped with control electrode for each bit (digit) is not good as the use of memory, and several digits of shift motion should be operated by the shift resister memory by applying some actions to whole bit lines. However it is not easy for the shift resister to send whole digit information correctly.

BRIEF DESCRIPTION OF THE DRAWINGS

Aspects of this disclosure will become apparent upon reading the following detailed description and upon reference to the accompanying drawings. The description and the associated drawings are provided to illustrate embodiments of the invention and not limited to the scope of the invention.

FIGS. 2A, 2B, and 2C are views showing an example of sequences of magnetic domain wall motion of a magnetic memory device of a first embodiment.

FIGS. 3A, 3B, and 3C are views showing an example of sequences of magnetic domain wall motion of a magnetic memory device of a first embodiment.

FIGS. 4A and 4B are views showing an example of sequences of magnetic domain wall motion of a magnetic memory device of a first embodiment.

DETAILED DESCRIPTION

Figure 1:
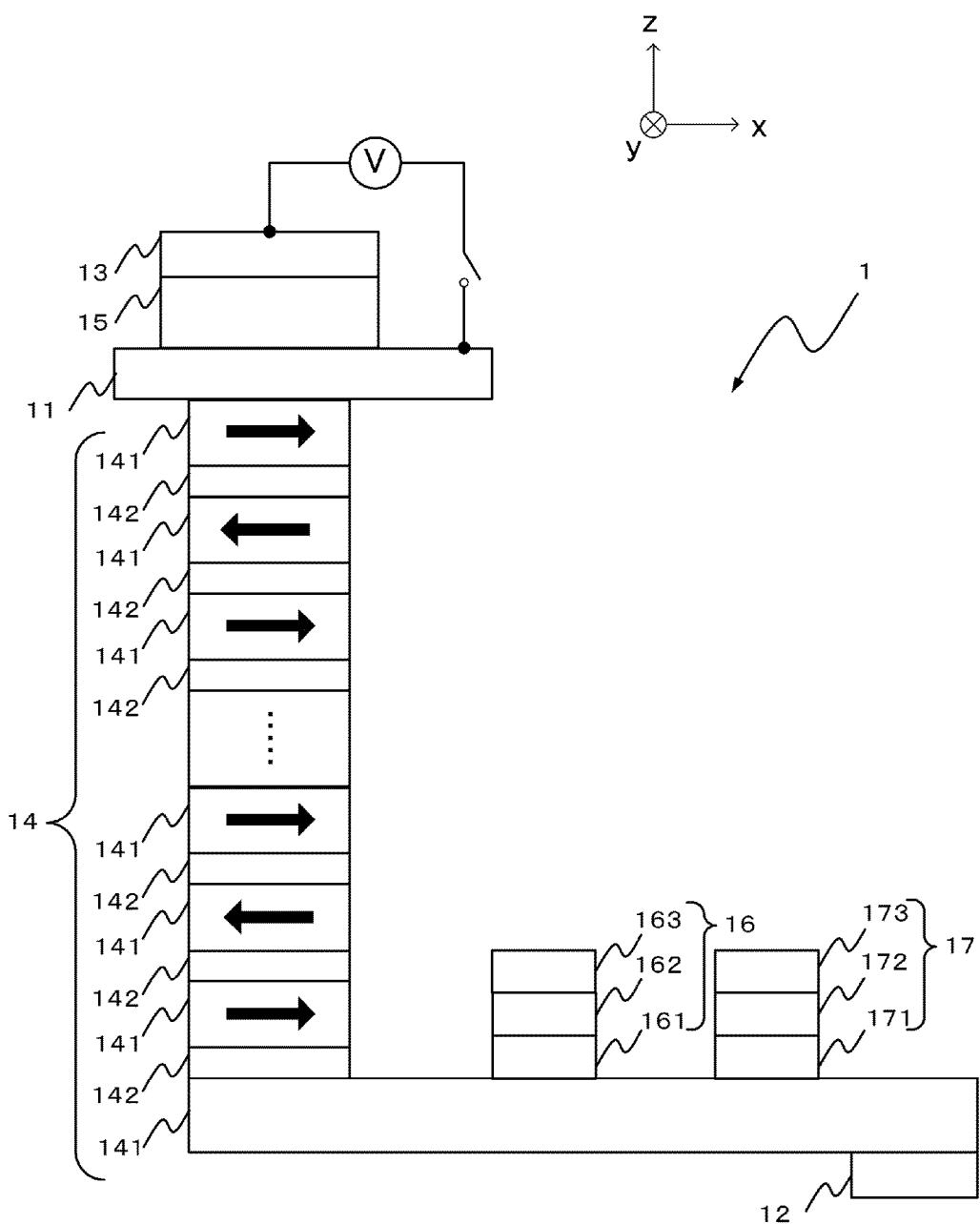
FIG. 1 is a schematic view showing a cross section of a magnetic memory device of a first embodiment.

Embodiments will be described below with reference to drawings. Wherever possible, the same reference numerals or marks will be used to denote the same or like portions throughout figures, and overlapped explanations are omitted in embodiments following a first embodiment.

First Embodiment

FIG. 1 shows a schematic view showing a cross section of a magnetic memory device of a first embodiment. The magnetic memory device I is provided on a substrate, and the magnetic memory device 1 comprises a first electrode 11, a second electrode 12, a third electrode 13, a laminated structure 14, a piezoelectric body 15, a writing section 16, and a reading section 17.

The laminated structure 14 comprises multilayer that a first magnetic layer 141 and a second magnetic layer 142 are laminated alternately, and the laminated structure 14 is formed like a wire between the first electrode 11 and the second electrode 12. The second magnetic layer 142 can be formed in contact with the first electrode 11 although the first magnetic layer 141 is formed in contact with the first electrode 11 in FIG. 1 A cross sectional shape cutting the first magnetic layer 141 and the second magnetic layer 142 in laminating direction, which corresponds to z-direction in FIG. 1 and is also called as z-direction, is rectangular shape, for example. The cross sectional shape is not limited for the rectangular shape, but the cross sectional shape is notable to be square, rectangle, polygon (hexagonal shape, for example), circle, ellipse, rhombus, or parallelogram. Aspect ratio of these shapes is from 1 to 1 to 1 to 4. The first magnetic layer 141 and the second magnetic layer 142 are comprised of different composition of constituent element each other. Magnetostriction constant of the first magnetic layer 141 has different sign from magnetostriction constant of the second magnetic layer 142. Or absolute value of the magnetostriction constant of the first magnetic layer 141 is smaller than the magnetostriction constant of the second magnetic layer 142 in the case where sign of the magnetostriction constant of the first magnetic layer 141 is different from sign of the magnetostriction constant of the second magnetic layer 142.

In-plane size, referring to a size which is parallel to z-direction, of the first magnetic layer 141 and the second magnetic layer 142 is markedly equal to or less than 100 nm not to generate inhomogeneous distribution of magnetization direction. Bit data is memorized as magnetization direction of given distance in the laminated structure 14 of the magnetic memory device in laminating direction. Typically one bit data per one first magnetic layer is reserved. Two or more bits data can be reserved in the magnetic memory device. However, one bit data per one first magnetic layer is reserved following description.

In FIG. 1 and following schematic figures, only several of the first magnetic layers 141 and the second magnetic layers 142 are shown in the laminated structure 14. However actual laminated structure 14 comprises much more the first magnetic layers 141 and the second magnetic layers 142 to be able to reserve from 100 bits data to several thousands data. The longer the whole length of the laminated structure 14 is, the laminated structure 14 can comprise more the second magnetic layers 142 and reserve a lot of bits data. However, the whole length of the laminated structure 14 is typically from 100 nm or more to 10 μm or less.

As mentioned above, the laminated structure 14 comprises a lot of magnetic domains, corresponding to bit data which is reserved in the magnetic memory device, in the laminated structure 14. At the border of two neighbouring magnetic domains, magnetization direction in laminating direction changes continuously. This changing region in magnetization direction is called magnetic domain wall. The magnetic domain wall has a finite width 'w' which is determined by the anisotropic energy or exchange stiffness of magnetic material.

The magnetization direction is not uniform in one first magnetic layer 141 when current is not applied to the laminated structure 14. Thus, the magnetic domain wall generates near the boundary between the first magnetic layer 141 and the second magnetic layer 142 when the magnetization directions of two first magnetic layers 142 sandwiching the second magnetic layer 142 are different. The width of the magnetic domain wall 'w' is described as $w=(A/Ku)^{1/2}$. As typical value, $A=1$ μerg/cm, $K=10^7$ erg/cm$^3$, and w=3 nm. The magnetic domain wall can be controlled easily in the second magnetic layer 142 when each layer thickness of the second magnetic layer 142 is larger than the width of the magnetic domain wall 'w' and is twice as small as the width of the magnetic domain wall 'w'. The magnetic memory device 1 enables to increase the ratio accounting for the magnetic layer 141 in the laminated structure 14. Thus the magnetic memory device 1 enables to increase the amount of memory information if the laminated structure 14 is regarded as the memory area in memory device. Each thickness of the first magnetic layer 141 is needed to be larger than the width of the magnetic domain wall 'w'. If the thickness of the first magnetic layer 141 is third times larger than the width of the magnetic domain wall, the volume of the area except for the magnetic domain wall is twice larger than the volume of the area of the magnetic domain wall, and the magnetization state can be reserved easily even if the magnetic domain wall exists in the first magnetic layer 141.

The magnetization direction of the first magnetic layer 141 and the magnetization direction of the second magnetic layer 142 neighboring the first magnetic layer 141 are substantially parallel or antiparallel to each other except for the area of the magnetic domain wall when voltage is not applied to the piezoelectric body 15.

A piezoelectric body 15 is provided on prolonged line which connects plural of the first magnetic layers 141 and the second magnetic layers 142. For example, in FIG. 1 the piezoelectric body 15 is provided between the first electrode 11 and the third electrode 13. One face of the piezoelectric body 15 is connected to the face opposite to the face where the first electrode 11 is connected to the laminated structure 14. The face, opposite to the face where the piezoelectric body 15 is connected to the first electrode 11, is connected to the third electrode 13.

Voltage can be applied between the first electrode 11 and the third electrode 13. A current source, which is not shown in figure, is connected between the first electrode 11 and the second electrode 12 and the current source enables to pass current in the laminated structure bi-directionally.

A writing section 16 comprises a nonmagnetic layer 161 and a ferromagnetic layer 162, and an electrode 163 and is connected to the laminated structure 14. A signal source, which is not shown in figure, is connected to the electrode 163. Voltage is applied to the electrode 163 from the signal source in order to write information in the magnetic memory device 1. In that case, spin-polarized electron flow passes in magnetization direction of the ferromagnetic layer 162 when electron passes from the electrode 163 to the laminated structure 14. The spin-polarized current flow makes the magnetization direction of the laminated structure 14 changed.

A reading section 17 comprises a nonmagnetic layer 171, ferromagnetic layer 172, and an electrode 173 and is connected to the laminated structure 14. In the case where the magnetization direction of the magnetic domain being connected with the reading section 17 of the laminated structure 14 is orientated in the same direction (parallel) to the magnetization direction of the ferromagnetic layer 172, a low-resistive state is generated between the electrode 173 and the second electrode 172. In the case where the magnetization direction of the magnetic domain being connected with the reading section 17 of the laminated structure 14 is orientated in the opposite direction (antiparallel) to the magnetization direction of the ferromagnetic layer 172, a high-resistive state is generated between the electrode 173 and the second electrode 12. Recorded information can be read by these resistance changes.

The magnetic memory device 1 enables to move bit data which is reserved in the laminated structure 14 without changing the order of the bit data by using following the magnetic domain wall motion steps. Thus before writing action and reading action, given bit data can be read and written in given position by moving the magnetic domain wall position at sufficient distance preliminarily.

Steps which move the magnetic domain wall in the laminated structure 14 of the magnetic memory device 1 at given distance in z-direction are explained. These steps comprise two steps. First step (step 1) is a step which passes current between the first electrode 11 and the second electrode 12 from time t1 to time t2 as shown in FIG. 2A. Second step (step 2) is a step which applies voltage between the first electrode 11 and the third electrode 13 from time t2 to time t4.

When current is flown between the first electrode 11 and the second electrode 12 (step 1), current which flows in the laminated structure 14 is spin-polarized. The spin-torque acts on the magnetization of the first magnetic layer 141 and the second magnetic layer 142 which comprise the laminated structure 14. For this reason, the magnetic domain wall in the laminated structure 14 moves. The direction of the magnetic domain wall motion is same as the direction of electron flow, which is opposite to the direction of current flow.

When voltage is applied between the first electrode 11 and the third electrode 13 (step 2), electric field is generated in the piezoelectric body 15 for the direction which connects first electrode 11 and the third electrode 13. In this case, the piezoelectric body 15 extends in the direction which connects the first electrode 11 and the third electrode 13 when the direction of electric field is same as the direction of polarization of the piezoelectric body 15. In contrast, the piezoelectric body 15 shrinks in the direction which connects the first electrode 11 and the third electrode 13 when the direction of electric field is opposite to the direction of polarization of the piezoelectric body 15.

In this case, due to inverse-magnetostrictive effect, a magnetic anisotropy is induced by the strain applying to the second magnetic layer 142 in the laminated structure 14. As a result, the magnetization direction of the second magnetic layer 142 changes from the state before starting the step 2.

As an example, the case, where the magnetization direction of the second magnetic layer 142 is oriented in the perpendicular direction (x-direction in FIG. 1) to z-direction by magnetocrystalline anisotropy or like before starting the step 2, is explained. In the case where the magnetostriction constant of the second magnetic layer 142 is positive, elastic energy increases in the perpendicular direction to laminating direction by tensile strain in z-direction. For this reason, the magnetization direction of the second magnetic layer 142 turns in parallel (z-direction) to the laminating direction, for example, because it is difficult for the magnetization of the second magnetic layer 142 to be in x-direction magnetization direction of the second magnetic layer 142. In the case where the magnetization coefficient of the second magnetic layer 142 is negative, elastic energy increases in x-direction by compressive strain in z-direction. For this reason, the magnetization direction of the second magnetic layer 142 turns in z-direction, for example, because it is difficult for the magnetization direction of the second magnetic layer 142 to be in x-direction.

When the strain is not applied to the laminated structure 14 after the step 2, the magnetic anisotropy of the second magnetic layer 142 returns to the state before the start of the step 2. Then, the magnetization direction of the second magnetic layer 142 turns to x-direction.

The strain corresponding to stretching of the piezoelectric body 15 by the step 2 is not only applied to the second magnetic layer 142 but also to the first magnetic layer 141. However in this embodiment, the sign of the magnetostriction constant of the first magnetic layer 141 is different from the sign of the magnetostriction constant of the second magnetic layer 142. Or the absolute value of the magnetostriction constant of the first magnetic layer 141 is smaller than the absolute value of the magnetostriction constant of the second magnetic layer 142 even if the magnetostriction constant of the first magnetic layer 141 is same as the magnetostriction constant of the second magnetic layer 142.

For this reason, magnetization direction of the first magnetic layer 141 is unchanged. The two cases are explained to explain this phenomenon.

In the first case where the sign of the magnetostriction constant of the first magnetic layer 141 is opposite to the sign of the magnetostriction constant of the second magnetic layer 142, the magnetization direction of the first magnetic layer 141 is unchanged because the elastic energy of the first layer decreases when the elastic energy increases in the x-direction of the second magnetic layer 142, for example.

In the second case where the absolute value of the magnetostriction constant of the first magnetic layer 141 is smaller than the absolute value of the magnetostriction constant of the second magnetic layer 142 even if the magnetostriction constant of the first magnetic layer 141 is same as the magnetostriction constant of the second magnetic layer 142, the magnetization direction of the first magnetic layer 141 is unchanged because the absolute value of the elastic energy which generates in the first magnetic layer 141 is small in the case where the elastic energy generates in x-direction of the second magnetic layer 142.

The case, where the magnetization direction of the second magnetic layer 142 turns in z-direction by crystalline magnetic anisotropy and shape magnetic anisotropy before the start of the step 2 is same as above cases. In the case where the magnetostriction constant of the second magnetic layer 142 is positive, elastic energy generates in z-direction by tensile strain in z-direction. For this reason, the magnetization direction of the second magnetic layer 142 turns in x-direction, for example, because it is difficult for the magnetization of the second magnetic layer 142 to be in z-direction. In the case where the magnetization coefficient of the second magnetic layer 142 is negative, elastic energy generates in x-direction by compressive strain in z-direction. For this reason, the magnetization direction of the second magnetic layer 142 turns in z-direction, for example, because it is difficult for the magnetization direction of the second magnetic layer 142 to be in z-direction.

The magnetization direction of the first magnetic layer 141 and the second magnetic layer 142 can be in x-direction or in z-direction before the start of the step 2. For example, when the magnetization direction of the first magnetic layer 141 is in x-direction, the magnetization direction of the second magnetic layer 142 is easily controlled at the action of the step 2 because the magnetization direction of the second magnetic layer 142 can be in z-direction by applying the magnetic anisotropy derived from the fine line shape of the laminated structure 14.

The magnetic domain wall can move from a first edge 'X1' of the first magnetic layer 141 to a second edge 'X2' of the first magnetic layer 141 by using the step 1 and the step 2 if the time duration (the time from t1 to t2) executing the step 1 is set longer than the time that the magnetic domain wall moves from the first edge X1 to the second edge 'X2'. The step 2 is started before the magnetic domain wall reaches the second edge 'X2'. The step 2 can be started before starting the step 1. Then, the step 2 is finished after finishing the step 1 ($t2 \leq t4$).

FIG. 2 shows an example for timing which executes the step 1 and the step 2 in the case where the magnetic domain wall moves only through one first magnetic layer 141. In FIG. 2 the step 1 is executed during executing the step 2 ($t3 \leq t1 \leq t2 \leq t4$). Thus, the magnetic domain wall can be stopped, before the second magnetic layer 142 if the step 2 is executed before starting the step 1 and after finishing the step 1. As shown in FIG. 2C, the magnetic domain wall stops at the second edge 'X2' at the time executing the step 1 and the step 2 simultaneously because the magnetic domain wall can propagate in the first magnetic layer 141 and cannot propagate in the second magnetic layer 142.

FIG. 3 shows an example for timing which executes the step 1 and the step 2 in the case where moving distance of the magnetic domain wall is longer than the case of the FIG. 2. The moving distance can be controlled by changing the time from starting the step 1 to starting the step 2. In FIG. 3 the magnetic domain wall moves through two first magnetic layer 141 and one second magnetic layer 142. For achieving this, the step 2 is executed, after the magnetic domain wall passes through the first of the first magnetic layer 141 and the first of the second magnetic layer 142 and reaches at the border 'X2' between the first of the second magnetic layer 142 and the second of the first magnetic layer 141 after starting the step 1 and before the magnetic domain wall reaches at the border 'X4' between the second of the first magnetic layer 141 and the second of the second magnetic layer 142.

In FIG. 2 and FIG. 3 current and voltage are constant in the case of the step 1 and the step 2. However the current value passing between the first electrode 11 and the second electrode 12 can be changed in the case of the step 1, and the voltage value applying between the first electrode 11 and the third electrode 13 can be changed in the case of the step 2. For example, as shown in FIG. 4 the current value and the voltage value can be changed two steps. In the case where the current value being flowed in the step 1 is not temporally constant, for example, the transition time that the magnetic domain wall transits from the static state to the moving state can be shortened if the former current intensity except for rising edge is larger than the later current intensity. In the case where the given voltage value is temporally constant, for example, the magnetic anisotropy of the second magnetic layer 142 derived from the applied strain becomes larger if the later voltage is larger than the former voltage. Then, the magnetic domain wall can be stably stopped.

Figure 5:
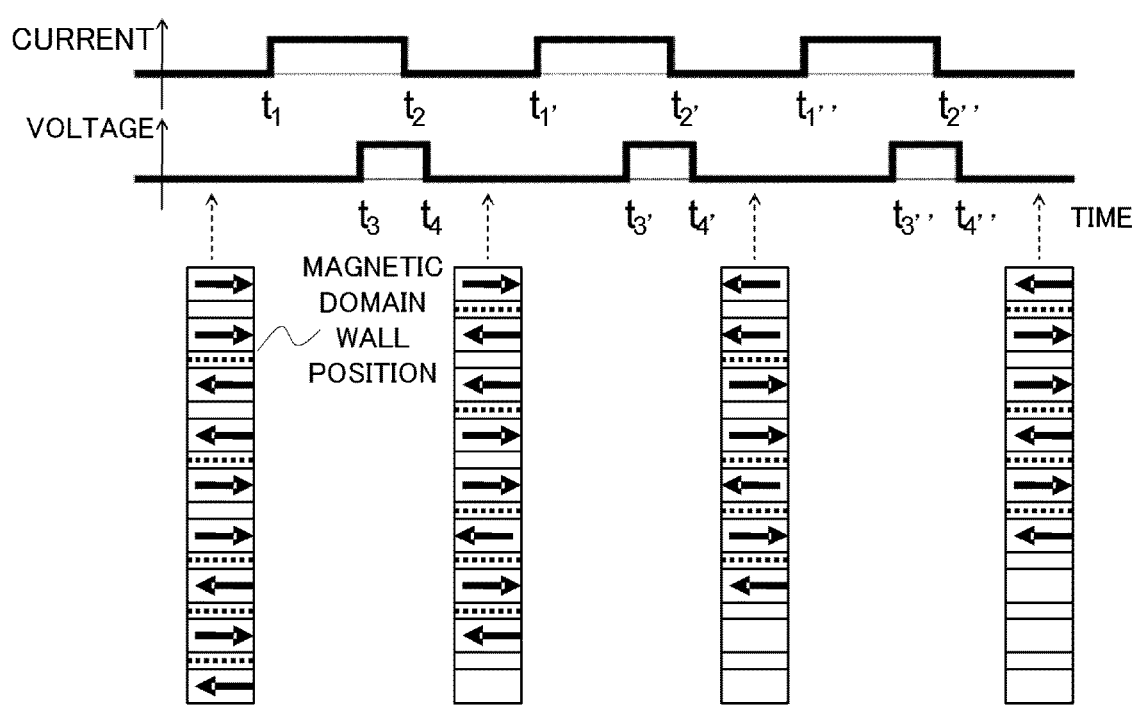
FIG. 5 is a view showing an example of sequences of magnetic domain wall motion of a magnetic memory device of a first embodiment.

FIG. 5 shows an example that the step 1 and the step 2 are repeated respectively (in the case of the FIG. 5, the repetition is three times). In the FIG. 5, a schematic view showing the distribution of the magnetization of the magnetic layer after the step 1 and the step 2 are executed. In this example, each position of the magnetic domain wall moves on the distance corresponding to the length of the first magnetic layer 141 in laminating direction of the laminated structure 14 every time the step 1 and the step 2 are executed. Thus, the distance from the magnetic domain wall to the successive magnetic domain wall is unchanged even if the step 1 and the step 2 are executed repeatedly. This indicates that on the magnetic memory device 1 the data whose is reserved during the moving process of the magnetic domain wall is not lost even if the position of the magnetic domain wall is moved.

As explained above, executing the step flowing current between the first electrode 11 and a third electrode and the step flowing current between a first electrode and a second electrode enables to control the moving distance of the magnetic domain wall stably.

Materials of the magnetic layer 141, 142 and the piezoelectric body 15 are explained. Several magnetic materials can be used for the first magnetic layer 141 and the second magnetic layer 142. For example, at least iron (Fe), cobalt (Co), and nickel (Ni) are typical materials. An alloy related to these elements is also used for the typical materials. Furthermore, at least one of elements selected from manganese (Mn), chromium (Cr), and palladium (Pd) can be added to the alloy. As these materials are based, several magnetic characteristics are realized by adding nonmagnetic element to these materials. Permalloy (NiFe alloy) and CoFe alloy or like can be used as a material whose magnetic anisotropy is not so high.

Current can be smaller when the magnetic domain wall is moved by spin injection current if the magnetization direction is in perpendicular to the laminating direction of the laminated structure 14 (x direction in the FIG. 1) rather than is in the laminating direction of the laminated structure 14 (z direction in the FIG. 1). In order for the magnetization direction to be perpendicular to the laminated structure 14, the magnetic anisotropy is needed to be large to overcome diamagnetic field because the diamagnetic field in the case where the magnetization direction is in orthogonal direction (short axis) to the laminated structure 14 is larger than the diamagnetic field in the case where the magnetization direction is in the direction of the laminated structure 14. For this reason, it is notable to use material comprising large magnetic anisotropy.

Following materials can be used for the material comprising large uniaxial-magnetic anisotropy (Ku). At least one element selected from iron (Fe), cobalt (Co), nickel (Ni), manganese (Mn), and chromium (Cr) and at least one element selected from platinum (Pt), palladium (Pd), iridium (Ir), Ruthenium (Ru), and Rhodium (Rh) can be used for the large uniaxial-magnetic anisotropy material. The value of the uniaxial-magnetic anisotropy can be controlled by adjusting the composition of the magnetic layer or crystalline arrangement in annealing.

Magnetic material that comprises hexagonal closed packing structure and perpendicular magnetic anisotropy to the laminating direction of the laminated structure 14 can be also used for the large uniaxial-magnetic anisotropy material. Metal comprising cobalt (Co) can be used for these materials. The other metal comprising the hexagonal closed packing structure can also be used.

In the case where the laminating direction of the laminated structure 14 is formed perpendicular to the substrate, it is needed for the easy axis of the magnetic anisotropy is in plane in order for the magnetization direction is in perpendicular to the laminated structure 14. Co, CoPt, and CoCrPt are used for material which comprises large magnetic anisotropy and that the easy axis of the magnetic anisotropy is in plane. CoPt and CoCrPt can be used as alloy. These materials are metallic crystalline whose c-axis of hexagonal closed packing structure is in plane. Furthermore, above any cases, additional elements can be added.

In the case where the laminating direction of the laminated structure 14 is formed parallel to the substrate (in the case where the laminated structure 14 is formed parallel in plane of substrate), it is needed for the easy axis of the magnetic anisotropy to be perpendicular to the plane. Co and CoPt, that c-axis of hexagonal closed packing structure is perpendicular to the plane, FePt, multilayer of (Co/Ni), and TbFe can be used for realizing these. CoPt can be used as alloy. In the case of using TbFe,TbFe comprises perpendicular magnetic anisotropy if Tb composition is ranged from 20 atomic % to 40 atomic %. Furthermore, above any cases, additional elements can be added.

The laminated structure 14 is formed perpendicular to the substrate better than the laminating direction of the laminated structure 14 is formed parallel to the substrate. This is because in this case the length of the second magnetic layer 142 in the fine line direction can be shorten and data amount in the laminated structure 14 can be larger.

The first magnetic layer 141 and the second magnetic layer 142 can be controlled by adding additive elements. The magnetostriction constant of the magnetic material added Ni element shifts to negative direction compared to the magnetic material without Ni element. The change amount of the magnetostriction constant of the magnetic material added Ni element depends on additive amount of Ni element. For example, by adding Ni element to the magnetic material comprising positive magnetostriction constant, the magnetostriction constant can be smaller. The magnetostriction constant can be almost zero by increasing additive amount of Ni element. Thus, positive or negative magnetostriction constant magnetic material can be used for the second magnetic layer 142. Positive magnetostriction constant magnetic material, added Ni element in order for the magnetostriction constant to be almost zero, comprising same material as the first magnetic layer 141 or different from that of the first magnetic layer 141 can be used for the first magnetic layer 141. These compositions can fabricate the magnetic memory device in this embodiment. The magnetic material can be negative magnetostriction constant by increasing content of Ni element. Thus, by adding Ni element to either the first magnetic layer 141 or the second magnetic layer 142, and forming positive magnetostriction constant material to one of the first magnetic layer 141 and the second magnetic layer 142, and negative magnetostriction constant material to the other can fabricate the magnetic memory device in this embodiment.

For another example, as method for shifting the magnetostriction constant to positive side, adding minute amounts of oxygen to the magnetic layer enables to control content of oxygen of the magnetic layer. Using this method enables to control small-negative magnetostriction constant for the material comprising large-negative magnetostriction constant and to form the material whose magnetostriction constant is almost zero. For example, the material whose magnetostriction constant is almost zero can be realized as the first magnetic layer 141. Or, these materials can be also used for the first magnetic layer 141 and the second magnetic layer 142 in order to be positive magnetostriction constant.

Rare earth and iron group transition element related alloy comprising perpendicular magnetic anisotropy in the fine line direction can be used. As this alloy, GdFe, GdCo, GdFeCo, TbFe, TbCo, TbFeCo, GdTbFe, GdTbCo, DyFe, DyCo, or DyFeCo can be used for the first magnetic layer 141 and the second magnetic layer 142.

Magnetic property, crystalline property, mechanical property, chemical property or various properties can be adjusted by adding nonmagnetic element such as Ag, Cu, Au, Al, Mg, Si, Bi, Ta, B, C, 0, N, Pd, Pt, Zr, Ir, W, Mo, Nb, or H to these magnetic materials used for the magnetic layer can be controlled.

Piezoelectric body being single crystalline or uniaxial can be used for the piezoelectric body 15 in order to be uniform strain applied to the laminated structure 14. Potassium sodium tartrate ($KNaC_4H_4O_6$), zinc oxide (ZnO), aluminum nitride (AlN), lead zirconium titanate ($PZT(Pb(Zr,Ti)O_3)$), zirconium titanate lanthanum lead (PLZT), crystal ($SiO_2$), lithium niobate ($LiNbO_3$), lithium tantalate ($LiTaO_3$), lithium tetraborate ($Li_2B_4O_7$), potassium niobate ($KNbO_3$), langasrte crystalline ($La_3Ga_5SiO_{14}$ or like), or potassium sodium tartrate tetrahydrate ($KNaC_4H_4O_6 4H_2O$) or like can be used for the piezoelectric body 15. On the basis of these piezoelectric materials, additive elements can be added in order to adjust property. The piezoelectric body 15 can be multilayer of these materials.

The materials same as used for the first magnetic layer 141 can be used for the ferromagnetic layer 162, 172 in the writing section 16 and the reading section 17.

Nonmagnetic metal or insulating film can be used for the nonmagnetic layer 161, 171 of the writing section and the reading section 17. One of the elements selected from Au, Cu, Cr, Zn, Ga, Nb, Mo, Ru, Pd, Ag, Hf, Ta, W, Pt, and Bi or alloy comprising at least one of these elements can be used for the nonmagnetic metal. The thickness of the nonmagnetic layer 161, 171 is the length so that magnetostatic coupling between the ferromagnetic layer 162, 172 and the magnetic layer 141 can be small and is smaller than spin diffusion length of the nonmagnetic layer 161, 171. The thickness of the nonmagnetic layer 161, 171 is ranged from 0.2 nm to 20 nm.

It is effective for the nonmagnetic layer 161, 171 to be used as tunneling barrier layer for insulating material used for the nonmagnetic layer 161, 171 in order to gain large magnetoresistive effect. In this case, $Al_2O_3$, $SiO_2$, MgO, AlN, $Bi_2O_3$, $MgF_2$, $CaF_2$, $SrTiO_3$, $AlLaO_3$, Al—N—O, Si—N—O, nonmagnetic semiconductor (ZnO, InMn, GaN, GaAs, $TiO_2$, Zn, Te, or doped transition metal into these materials), or like can be used for the nonmagnetic layer 161, 171. These compounds are not completely correct composition stoichiometrically, and can be luck or excess of oxygen, nitrogen or, fluorine. The thickness of the nonmagnetic layer 161, 171 comprised of this insulating material is raged from 2 nm to 5 nm. In the case where the nonmagnetic layer 161, 171 is insulating layer, pinhole (PH) can be in the nonmagnetic layer 161, 171.

Fabrication process of the magnetic memory device will be explained. The magnetic memory device 1 is fabricated by used of sputtering and lithography. The fabrication process of the magnetic memory device 1 is explained as the following.

First, a silicon substrate is etched by use of a mask and the second electrode 12 is buried in the silicon substrate. Next, the first magnetic layer 141 is deposited on the silicon substrate where the second electrode 12 is buried. And, a nonmagnetic layer, a ferromagnetic layer, and a metal layer (can be used as electrode) are deposited on the first magnetic layer 141 in this order.

Next, the writing section 16 and the reading section 17 are formed by use of a mask and etching from the metal layer to the nonmagnetic layer so that the surface of the magnetic layer of the first magnetic layer 141 is uncovered.

Next, an insulating layer is deposited on the first magnetic layer 141 and the metal layer of the writing section 16 and the reading section 17. Then, an opening is formed by etching the insulating layer so that the part of the insulating layer is uncovered.

Next, the laminated structure 14 whose height is over the height of the writing section 16 and the reading section 17 is formed by depositing the second magnetic layer 142 and the first magnetic layer 141 alternately. For example, the deposition repeat count is about 200 layers.

Furthermore, the first electrode 11 is formed on the first magnetic layer 141, and the piezoelectric body 15 is formed on the first electrode 11, and the third electrode 13 is formed on the piezoelectric body 15. Finally, the surround of the magnetic memory device is buried by an insulating layer.

Modified Example

Figure 6:
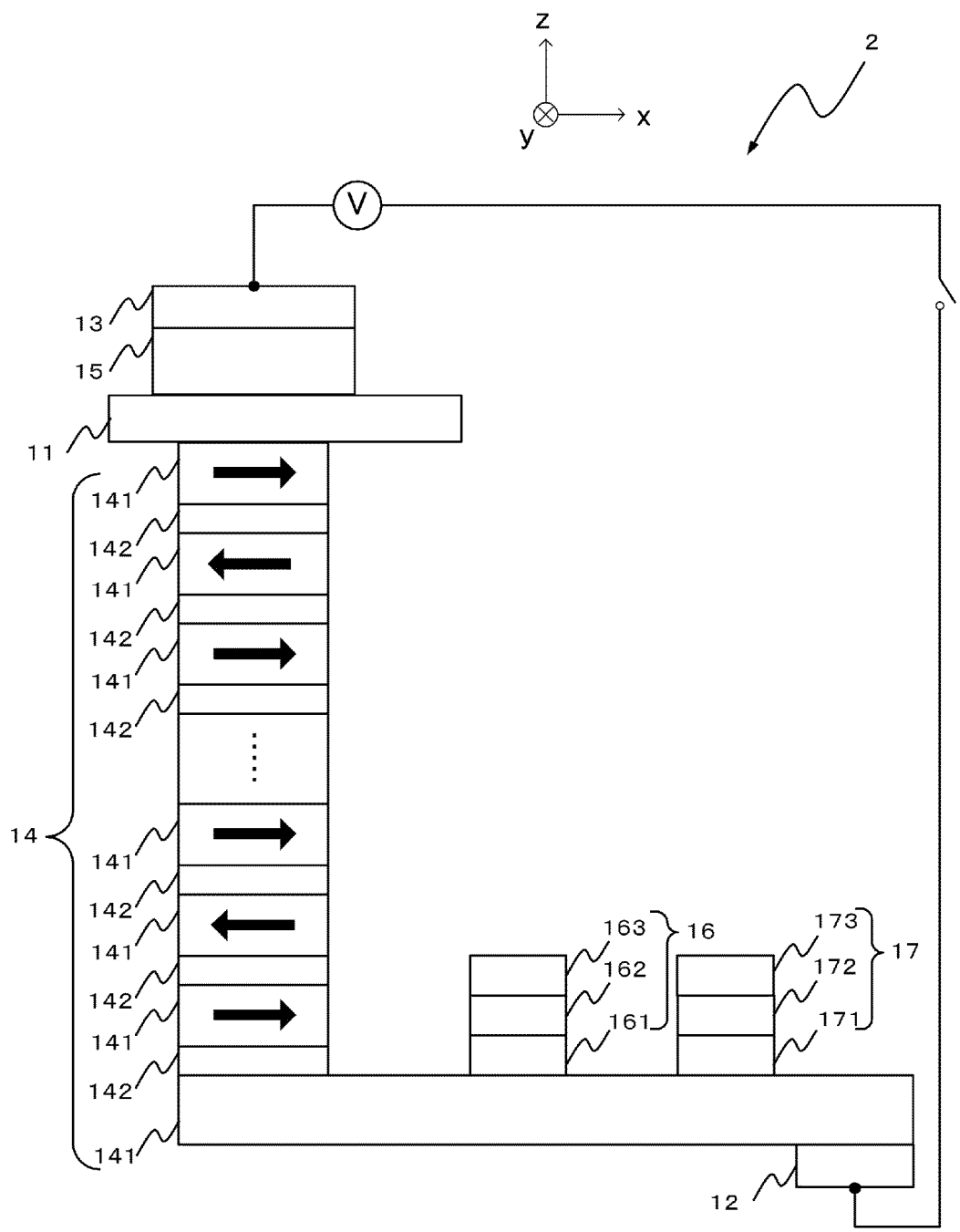
FIG. 6 is a schematic view showing a modified example of cross section of a magnetic memory device of a first embodiment.

This embodiment can be used for any transformation. In the FIG. 1 and above explanation, voltage is applied between the first electrode 11 and the third electrode 13. However, as shown in FIG. 6 the piezoelectric body 15 can be shrunk by applying voltage between the second electrode 12 and the third electrode 13.

Figure 7:
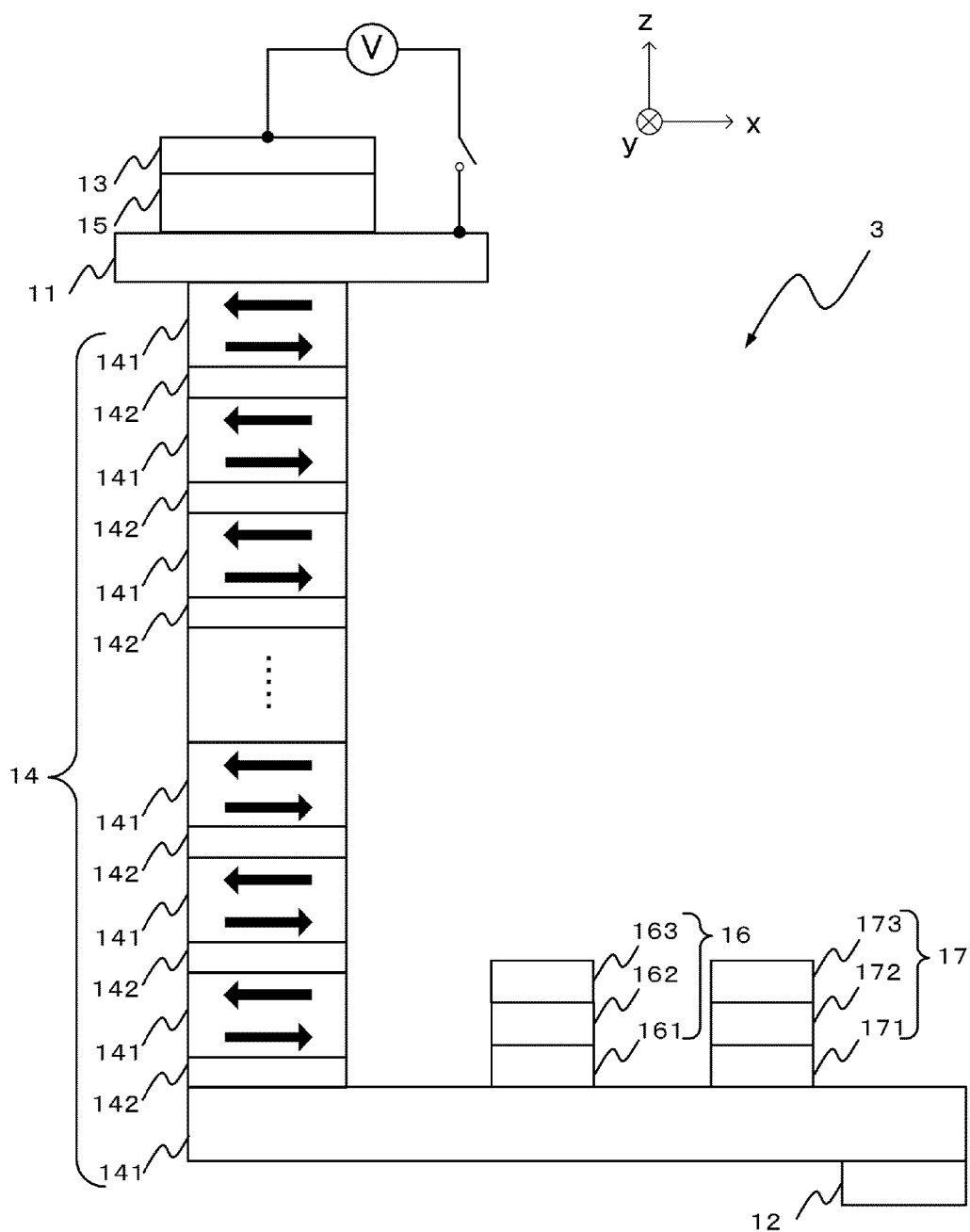
FIG. 7 is a schematic view showing a modified example of cross section of a magnetic memory device of a first embodiment.

As shown in FIG. 7, some bits data can be stored in one first magnetic layer 141 if the thickness of the first magnetic layer 141 is enough thick in the laminating direction (z direction).

Some concaves whose cross sectional area of the laminated structure 14 are different from the other part of the laminated structure 14 can be provided in the laminated structure 14 in the laminating direction (z direction), at regular interval. If such area is provided, pinning potential become higher for the magnetic domain wall and the magnetic domain wall is easy to be controlled.

Figure 8:
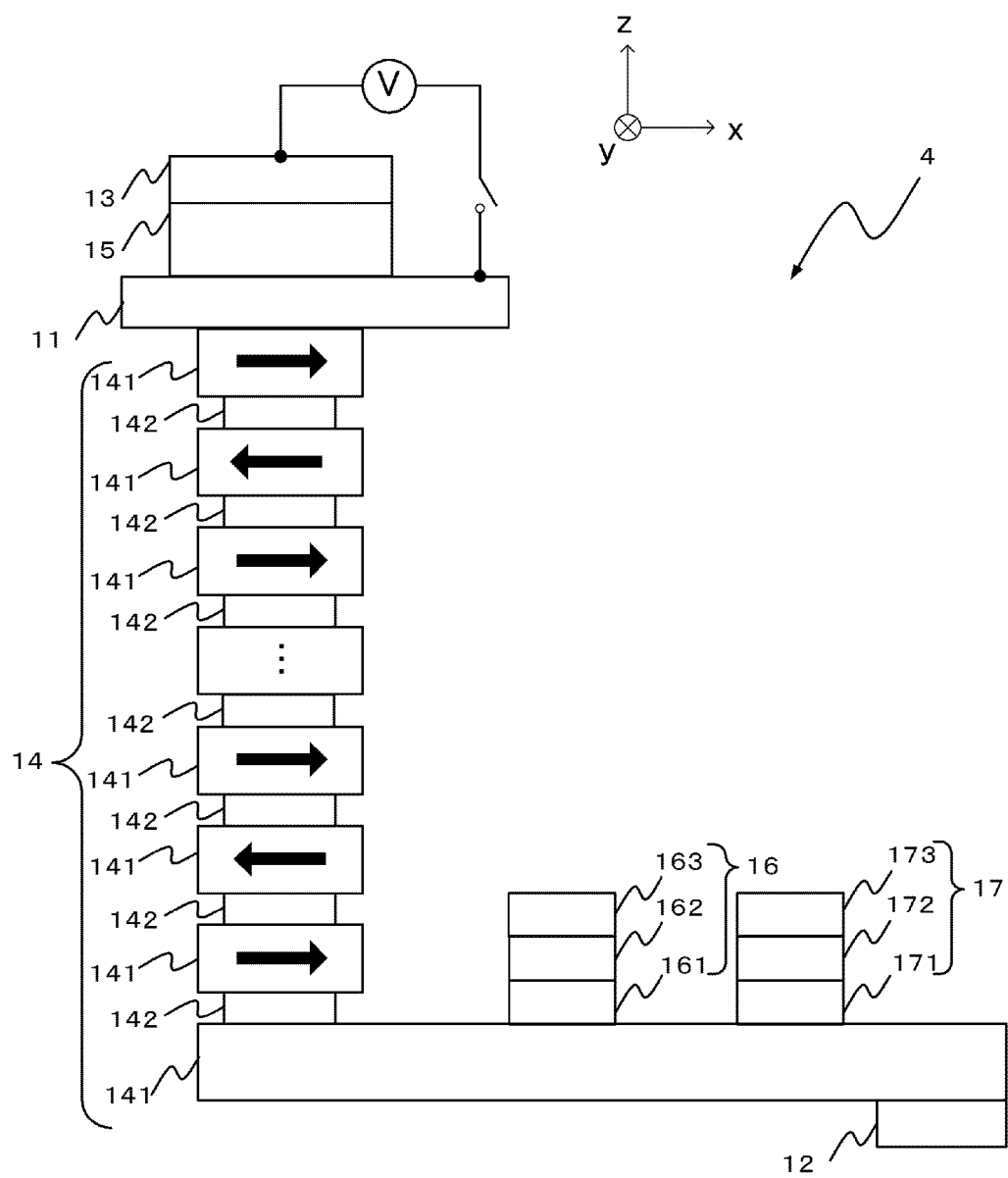
FIG. 8 is a schematic view showing a modified example of cross section of a magnetic memory device of a first embodiment.

As shown in FIG. 8, anisotropy of the second magnetic layer 142 can be easily controlled by inverse-magnetostrictive effect because the second magnetic layer 142 is applied larger strain than the first magnetic layer 141 if the cross sectional area of the second magnetic layer 142 is smaller than the first magnetic layer 141.

In the case where the cross sectional area of the second magnetic layer 142 is differentiated by the distance from the piezoelectric body 15, the strain applying to the second magnetic layer 142 can be equalized if the thickness of the second magnetic layer 142 comprising small cross sectional area is larger than the thickness of the second magnetic layer 142 comprising large cross sectional area.

Figure 9A:
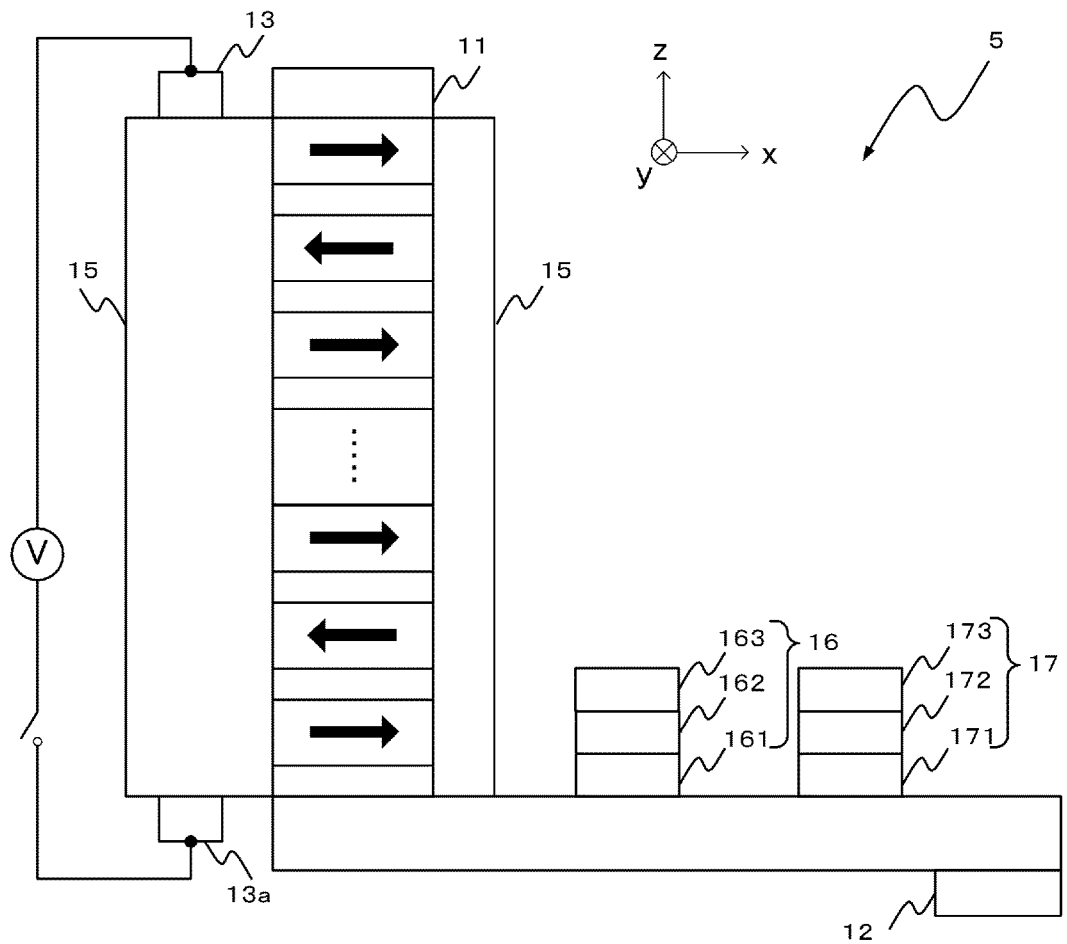
FIGS. 9A and 9B are schematic views showing a modified example of cross section of a magnetic memory device and a piezoelectric body of a first embodiment.
Figure 9B:
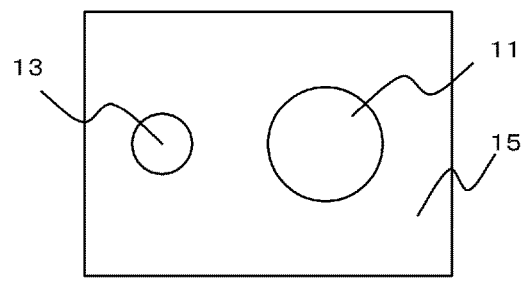

The laminated structure 14 can be surrounded by the piezoelectric body 15. FIG. 9A is a schematic view showing the cross sectional image of the magnetic memory device 5 being provided so that the laminated structure 14 is surrounded by the piezoelectric body 15 in the axis of the laminated structure 14. FIG. 9B is an upper view of the magnetic memory device 5. By providing the piezoelectric body 15 like this, the laminated structure 14 can be applied strain uniformly when voltage is applied between the third electrode 13 and a fourth electrode 13a.

Figure 10A:
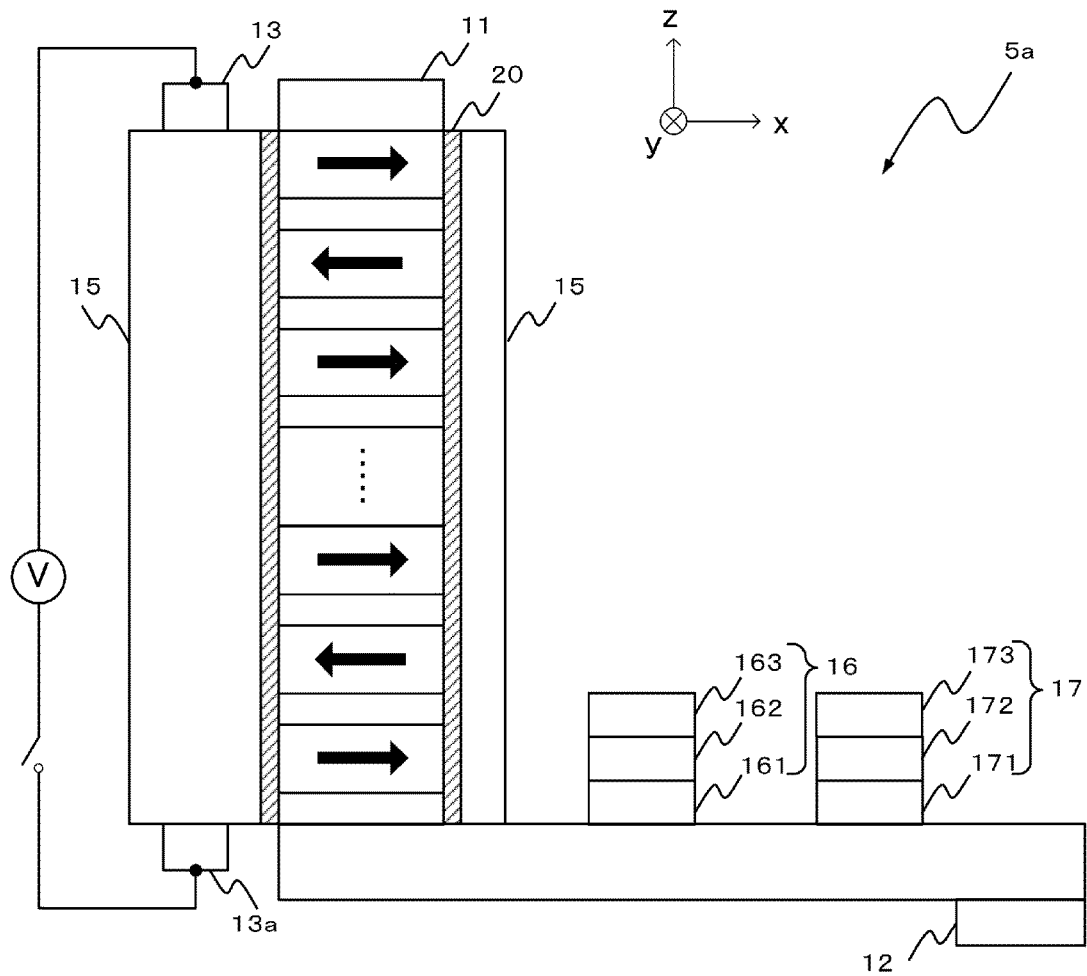
FIGS. 10A and 10B are schematic views showing a modified example of cross section of a magnetic memory device and a piezoelectric body of a first embodiment.
Figure 10B:
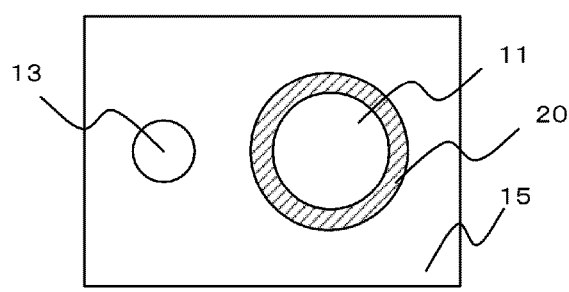

In FIG. 9 the piezoelectric body 15 is provided so that the piezoelectric body 15 is contact with the laminated structure 14. However, as shown in FIG. 10 an insulator 20, such as an amorphous $SiO_2$, an amorphous $Al2O3$, can be formed between the laminated structure 14 and the piezoelectric body 15.

Figure 11:
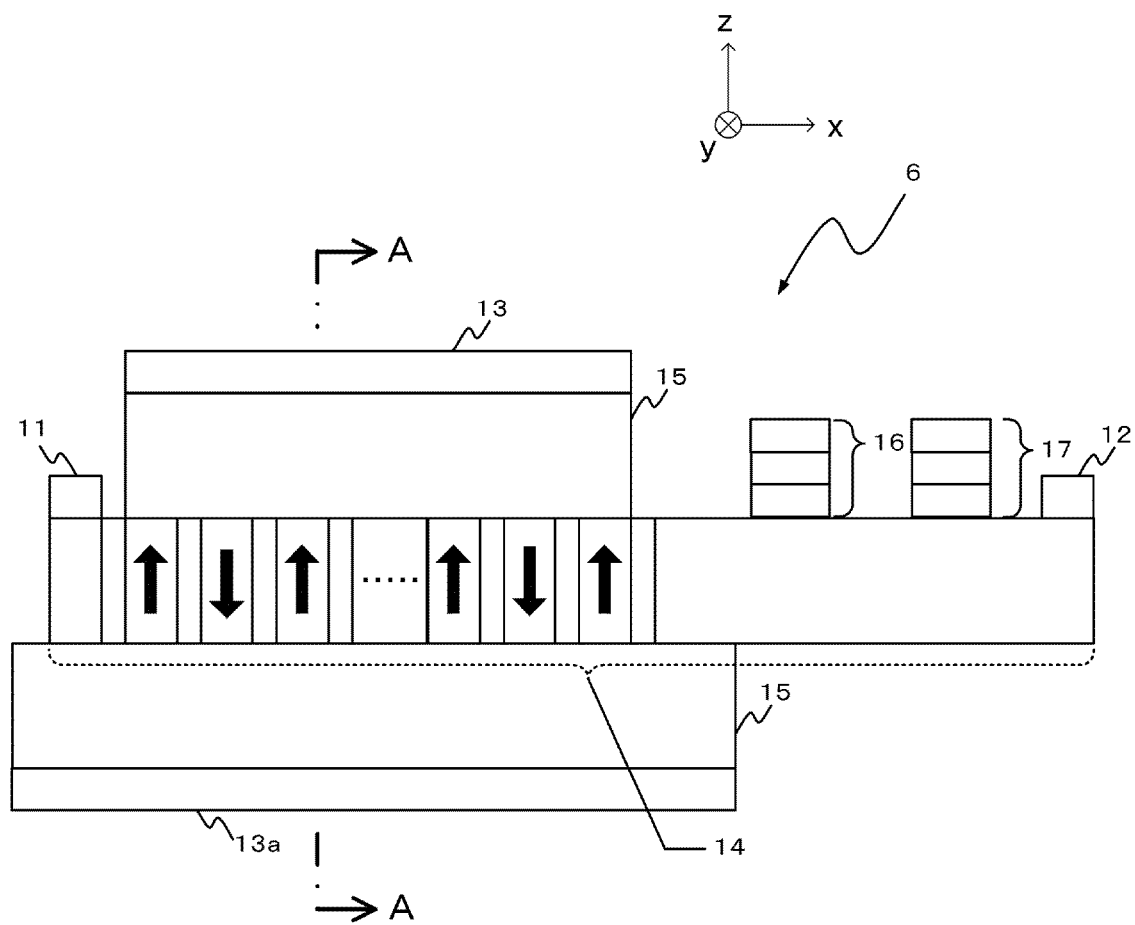
FIG. 11 is a schematic view showing a modified example of cross section of a magnetic memory device of a first embodiment.
Figure 12:
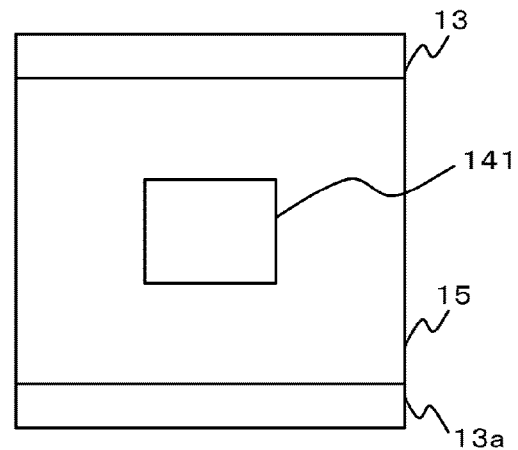
FIG. 12 is a schematic view showing a modified example of cross section of a magnetic memory device of a first embodiment.
Figure 13:
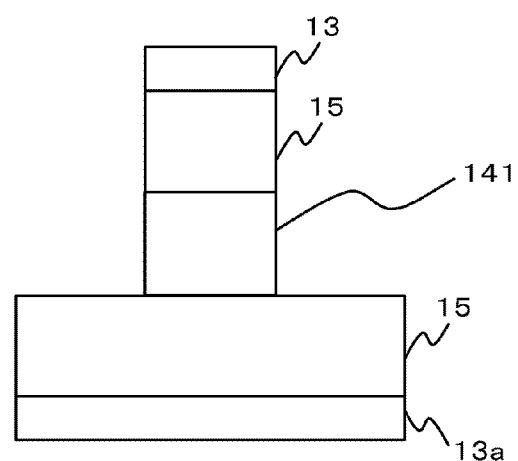
FIG. 13 is a schematic view showing a modified example of cross section of a magnetic memory device of a first embodiment.
Figure 14:
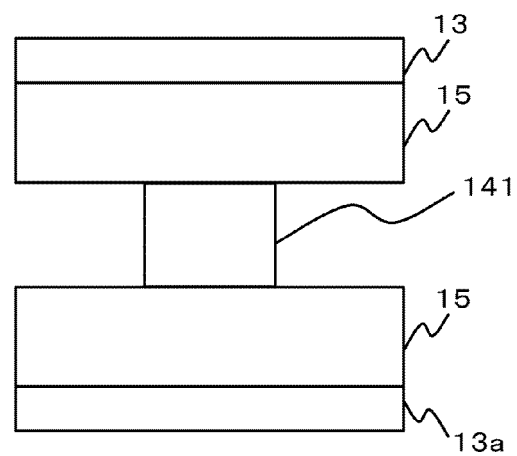
FIG. 14 is a schematic view showing a modified example of cross section of a magnetic memory device of a first embodiment.

FIG. 11 is an example showing that the laminated structure 14 is formed in parallel to a substrate. The third electrode 13 and the fourth electrode 13a is provided upper side and lower side of the piezoelectric body 15, and electric field can be applied to the upper and lower of the laminated structure 14. In this case, the laminated structure 14 can be surrounded by the piezoelectric body 15 as shown in FIG. 12 showing a cross sectional image being cut on A-A line in the figure. Or, as shown in FIG. 13 and FIG. 14, the piezoelectric body 15 can be provided on only the upper side and the lower side of the laminated structure 14.

Figure 15A:
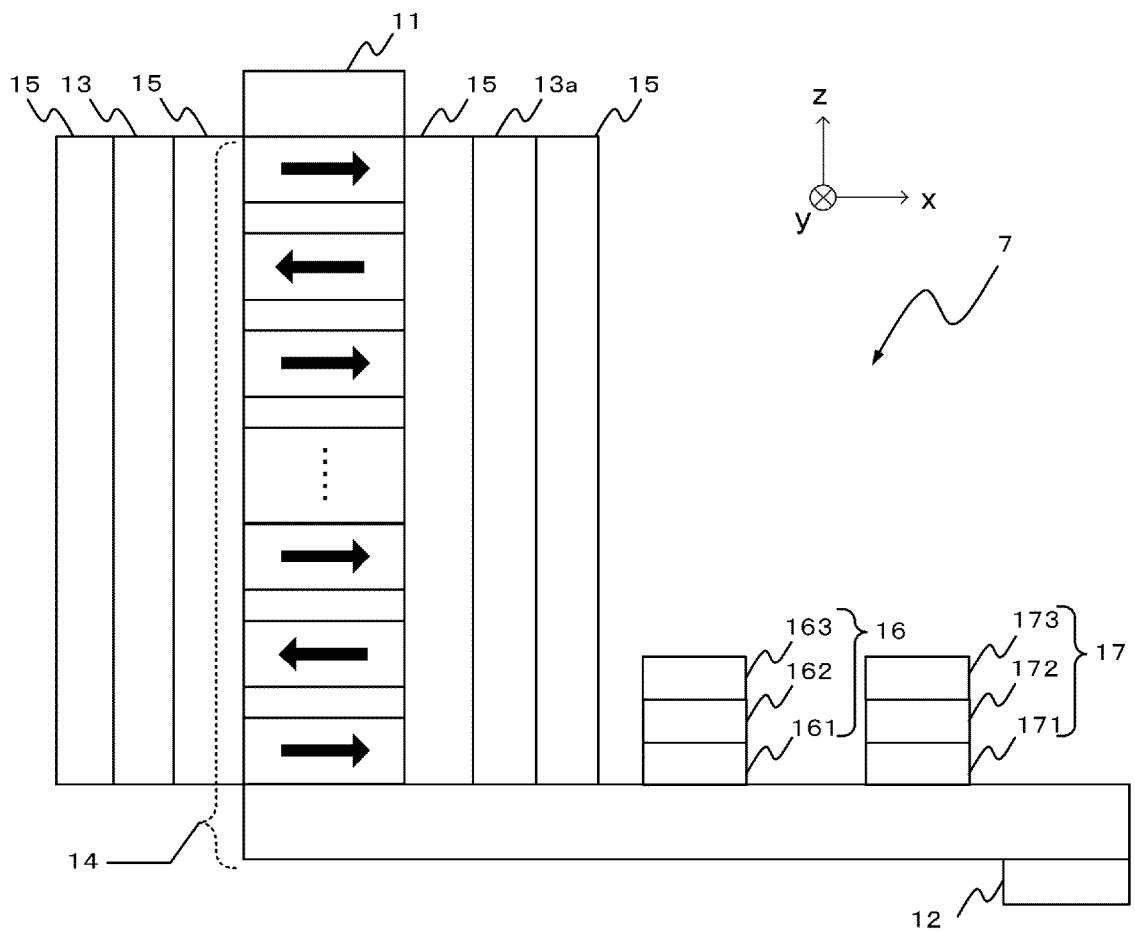
FIGS. 15A and 15B are schematic views showing a modified example of cross section of a magnetic memory device and a piezoelectric body of a first embodiment.
Figure 15B:
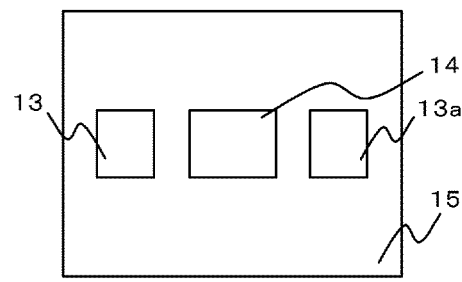

FIG. 15 is a schematic view of the magnetic memory device 7 so that the laminated structure 14 is surrounded by the piezoelectric body 15. FIG. 15 is an example that shows the shape and position of the third electrode 13 and the fourth electrode 13a of the magnetic memory device 5, shown in FIG. 9, are changed. In this example, each of the third electrode 13 and the fourth electrode 13a comprises a pillar shape. Electric field is applied in the direction orthogonal to the laminating direction of the laminated structure 14 if voltage is applied between the third electrode 13 and the fourth electrode 13a by the step 2, because the laminated structure 14 is provided in the plane position connecting from the third electrode 13 to the fourth electrode 13a.

In this case, the operation is essentially the same as that in the case where electric field is applied in the laminating direction of the laminated structure 14 mentioned above. The magnetization direction of the second magnetic layer 142 is in the orthogonal direction to the laminated structure 14, and in the case where the magnetostriction constant of the second magnetic layer 142 is positive, for example, the elastic energy increases in the orthogonal direction to the laminating direction of the laminated structure 14 and the magnetization direction cannot keep the orthogonal direction to the laminating direction of the laminated structure 14 and the magnetization direction results in being in parallel direction to the fine line, by applying voltage so that compressive strain is applied between the third electrode 13 and the fourth electrode 13a in the orthogonal direction to the laminating direction of the laminated structure 14. Thus, in this case, the magnetic domain wall can also be stopped at the second magnetic layer 142 by use of the step 2. In this case, the third electrode 13 and fourth electrode 13a can comprise different cross sectional area respectively.

Figure 16A:
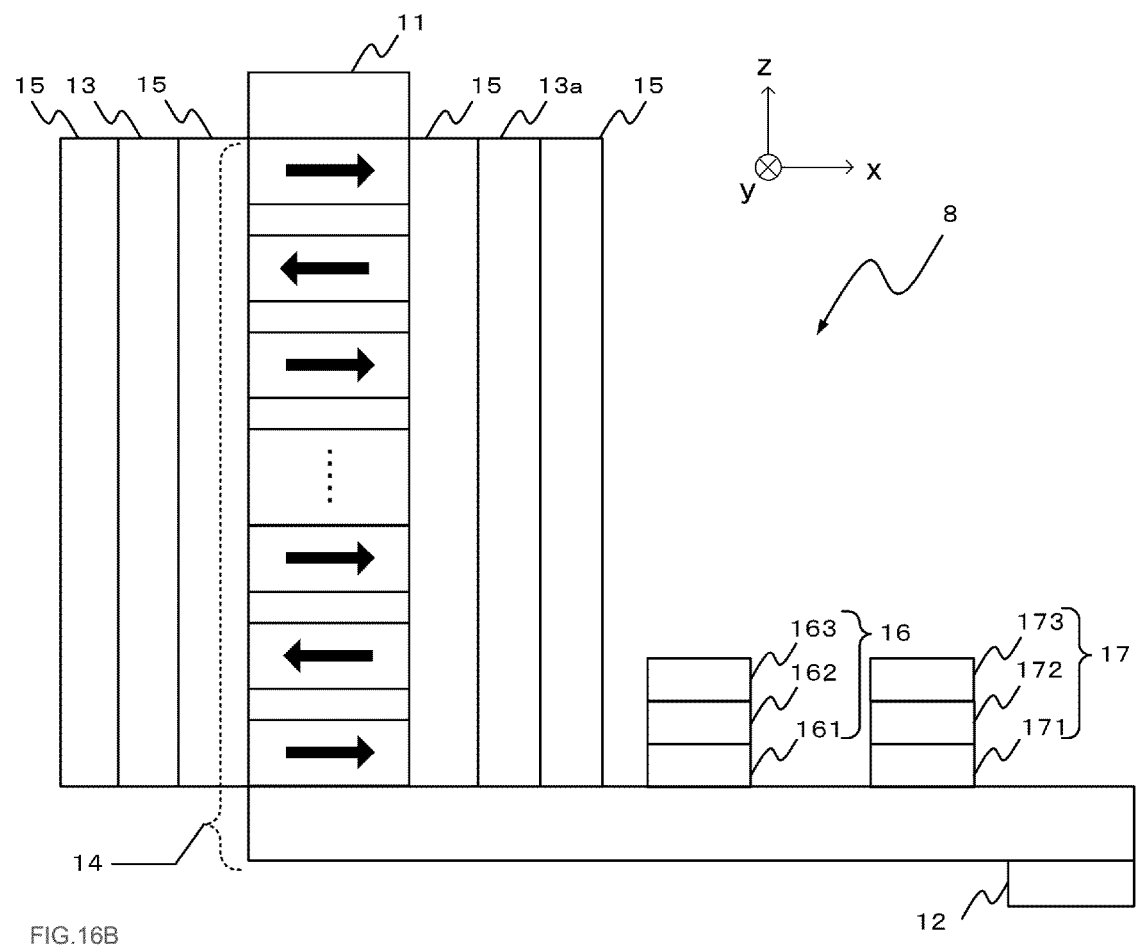
FIGS. 16A and 16B are schematic views showing a modified example of cross section of a magnetic memory device and a piezoelectric body of a first embodiment.
Figure 16B:
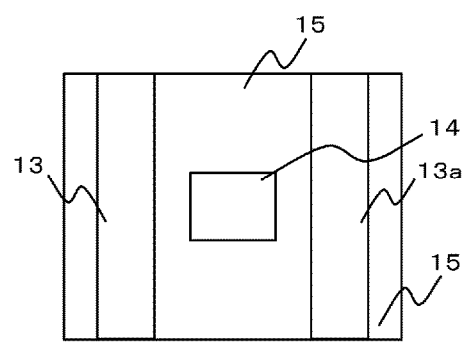

As shown in FIG. 16, the third electrode 13 and the fourth electrode 13a can be as formed in flat plate shape, plural laminated structures 14 can be provided in a pair of the third electrode 13 and the fourth electrode 13a. In this case, the number of lines to select the third electrode 13 and the fourth electrode 13a can be diminished because the third electrode 13 and the fourth electrode 13a can be used commonly for the plural laminated structures 14. The selectivity of the laminated structure 14 is not lost even if the third electrode 13 and the fourth electrode 13a is used commonly for the plural laminated structures 14, because the magnetic domain wall motion does not generate even if the only step 2 is executed.

Figure 17:
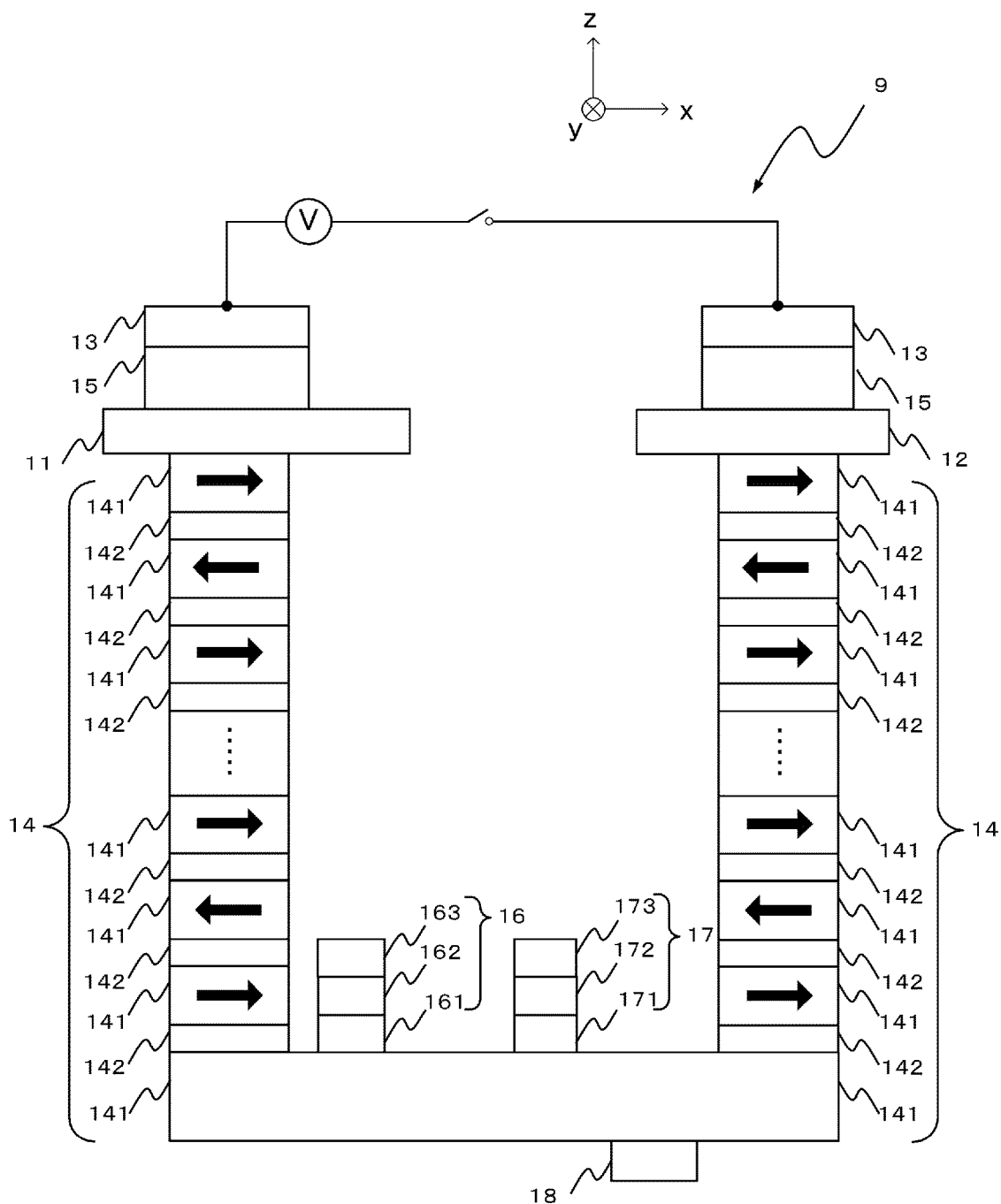
FIG. 17 is a schematic view showing a modified example of cross section of a magnetic memory device of a first embodiment.

As shown in FIG. 17, the first magnetic layer 141 and the second magnetic layer 142 can be provided on the both edges of the first magnetic layer 141, and the writing section 16 and the reading section 17 are provided on the edges.

Second Embodiment

Figure 18:
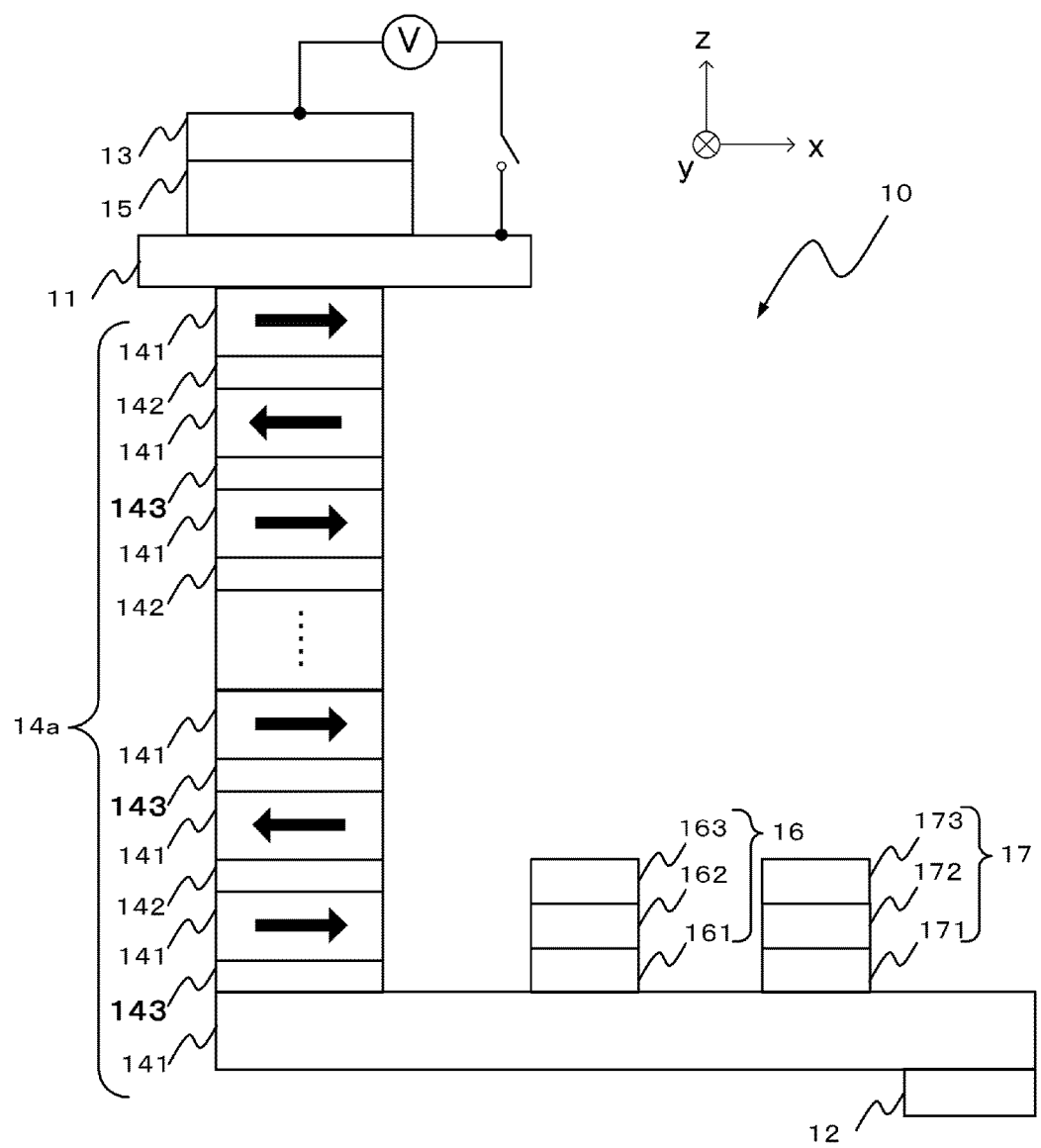
FIG. 18 is a schematic view showing a magnetic memory device in a second embodiment.

FIG. 18 is a schematic view of a cross sectional image of the magnetic memory device of the second embodiment. The same components as the magnetic memory device 10 of the first embodiment are shown by the same sign, and detail explanation is omitted. The magnetic memory device 10 of the second embodiment comprises the laminated structure 14a being arrayed the second magnetic layer 142 and a third magnetic layer 143 alternately in the place of plural second magnetic layer 142 of the magnetic memory device 1 of the first embodiment. The second magnetic layer 142 or the third magnetic layer 143 is provided between the first magnetic layers 141 of the laminated structure 14a, and the second magnetic layer 142 is provided between a first phase of the first magnetic layer 141 and the first magnetic layer 141 which is near to the first phase, and the third magnetic layer 143 is provided between the opposite phase to the first phase and the first magnetic layer 141 which is near to the opposite phase.

Each of the absolute value of the magnetostriction constant of the second magnetic layer 142 and the third magnetic layer 143 is larger than the absolute value of the magnetostriction constant of the first magnetic layer 141, and the magnetostriction constant of the second magnetic layer 142 is opposite to that of the third magnetic layer 143. Hereinafter, for example, the embodiment will be described that the sign of the magnetostriction constant is positive, and the sign of the third magnetostriction constant is negative.

The steps that magnetic domain wall in the laminated structure 14a of the magnetic memory device 10 is moved in the fine line direction at regular interval will be described. These steps comprise a step 1 that current is applied between the first electrode 11 and the second electrode 12 from the time t1 to the time t2 as shown in FIG. 19A, a step 2 that positive voltage is applied between the first electrode 11 and the third electrode 13 from the time t3 to the time t4 as shown in FIG. 19B, and a step 3 that negative voltage is applied between the first electrode 11 and the third electrode 13 from the time t5 to the time t6.

Current applied in the laminated structure 14a is spin-polarized, and spin torque is applied to the magnetization of the first magnetic layer 141, the second magnetic layer 142, and the third magnetic layer comprising the laminated structure 14a when current is applied between the first electrode 11 and the second electrode 12 by the step 1. Thus, the magnetic domain wall moves in the laminated structure 14a. The motion direction of the magnetic domain wall is the same direction as the motion direction of electron. Thus, the motion direction of the magnetic domain wall is opposite to the current direction.

Figure 19:
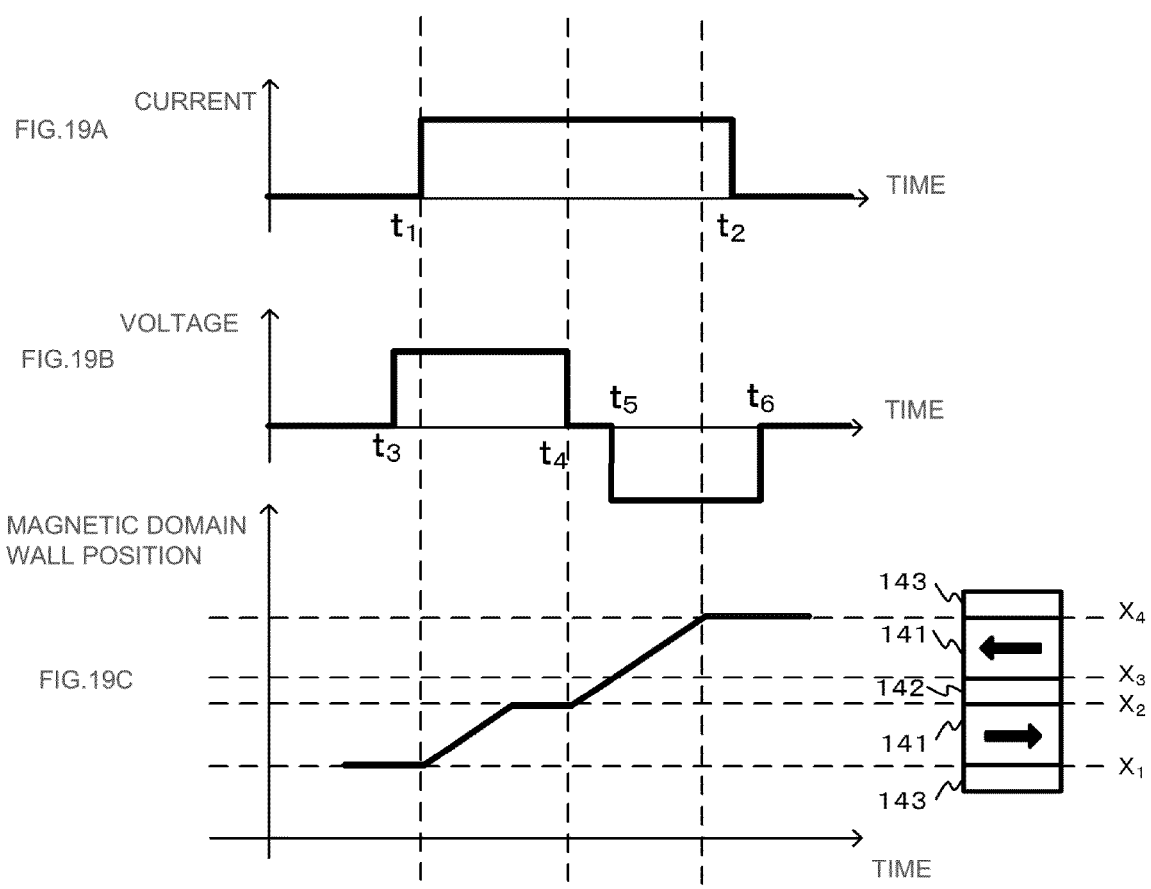
FIGS. 19A, 19B, and 19C are views showing an example of sequences of magnetic domain wall motion of a magnetic memory device of a second embodiment.

Electric field is generated in the direction connecting the first electrode 11 to the third electrode 13 in a piezoelectric layer 15 when positive voltage is applied between the first electrode 11 and the third electrode 13 by the step 2. Then, in the case where the electric field direction is same as the direction of polarization of the piezoelectric body 15, the piezoelectric layer 15 is extended in the direction connecting the first electrode 11 to the third electrode 13. In the case where the electric field direction is opposite to the direction of polarization of the piezoelectric body 15, the piezoelectric body 15 is compressed in the direction connecting the first electrode 11 to the third electrode 13. The applied strain corresponding to this compression is applied to the laminated structure 14a through the first electrode 11. In this case, magnetic anisotropy is induced by the applied strain due to the inverse-magnetosrtictive effect in the second magnetic layer 142 and the magnetization direction of the second magnetic layer 142 changes from the state before starting the step 2. Although the magnetic anisotropy is also induced by the applied strain due to the inverse-magnetostrictive effect in the third magnetic layer 143, the magnetization direction of the third magnetic layer 143 does not change because the sign of the magnetostriction constant of the third magnetic layer 143 is opposite to that of the second magnetic layer 142. As shown in FIG. 19, in the case where the step 2 finishes before the completing time of the step 1 (t4≤t2), the magnetic domain wall does not pass through the second magnetic layer 142 at the time that the step 1 and the step 2 are executed simultaneously although the magnetic domain wall propagates in the first magnetic layer 141 and the third magnetic layer 143. Thus, the second magnetic layer 142 works as stopping the magnetic domain wall motion during executing the step 2.

Electric field is generated in the piezoelectric layer 15 in the direction connecting the first electrode 11 to the third electrode 13 when negative voltage is applied between the first electrode 11 and the third electrode 13 by the step 3. Then, in the case where the electric field direction is same direction as the polarization direction of the piezoelectric body 15, the piezoelectric body 15 extends in the direction connecting the first electrode 11 to the third electrode 13. In the opposite case, the piezoelectric body 15 shrinks in the first electrode 11 to the third electrode 13. The applied strain corresponding to this shrinking is applied to the laminated structure 14a through the first electrode 11. In this case, the magnetic anisotropy derived from the applied strain generates by the inverse-magnetostrictive effect in the third magnetic layer 143 and the magnetization direction of the third magnetic layer 143 changes from the state before starting the step 3. Although the magnetic anisotropy derived from the applied strain also generates by the inverse-magnetostrictive effect in the third magnetic layer 143, the magnetization direction of the third magnetic layer 143 does not change because the sign of the magnetostriction constant of the third magnetic layer 143 is opposite to that of the second magnetic layer 142. As shown in FIG. 19, in the case where the step 1 finishes before the completing time of the step 3 (t2≤t6), the magnetic domain wall does not pass through the third magnetic layer 143 at the time that the step 1 and the step 3 are executed simultaneously although the magnetic domain wall propagates in the first magnetic layer 141 and the second magnetic layer 142. Thus, the third magnetic layer 143 works as a stopping layer where the magnetic domain wall stop moving during executing the step 3.

As mentioned above, by executing the step 1 and the step 3, for example, as shown in FIG. 19C the magnetic domain wall can be moved from the first edge X1 of the first of the first magnetic layer 141 to the second edge X4 of next first magnetic layer 141. As shown in FIG. 19C, to move the magnetic domain wall from the first edge X1 of the first of the first magnetic layer 141 to the second edge X4 of the second of the first magnetic layer 141 sandwiching the second magnetic layer 142, the start time and finish time of the step 1~step 3 are set as below.

Thus, after start of the step 1, the step 1 finishes after the time that the magnetic domain wall reaches the second edge X4 of the second of the first magnetic layer 141. This enables the magnetic domain wall to reach stably the second edge X4 of the second of the first magnetic layer 141. After start of the step 1, the step 2 starts before the time that the magnetic domain wall reaches the second edge X2 of the first of the first magnetic layer 141. This prevents the magnetic domain wall from moving ahead of the second magnetic layer 142. After start of the step 1, the step 2 finishes after the magnetic domain wall reaches the second edge X2 of the first of the first magnetic layer 141, and after the step 2 finishes, the step 3 starts before the magnetic domain wall reaches the second edge X4 of the second of the first magnetic layer 141. This enables the magnetic domain wall to move through the second magnetic layer 142. And this enables also to prevent the magnetic domain wall from moving ahead of the third magnetic layer 143.

As mentioned above, according to the magnetic memory device 10 of the second embodiment, when the magnetic domain wall moves through one of the second magnetic layer 142 and the third magnetic layer 143, the magnetic domain motion can be controlled stably because the other prevents the magnetic domain wall from moving.

The step 2 and the step 3 can be executed plural times during executing the step 1. The number of the times of executing the step 2 and the step 3 can be determined corresponding to the number of first magnetic layer 141 that makes the magnetic domain wall moved. The finish time of the step 2 or the step 3 out of executing the step 2 or the step 3 plural times which is executed at final is to be after the finish time of the step 1. This enables the magnetic domain wall to move stably the distance corresponding to plural of the first magnetic layers 141 during given time.

Figure 20:
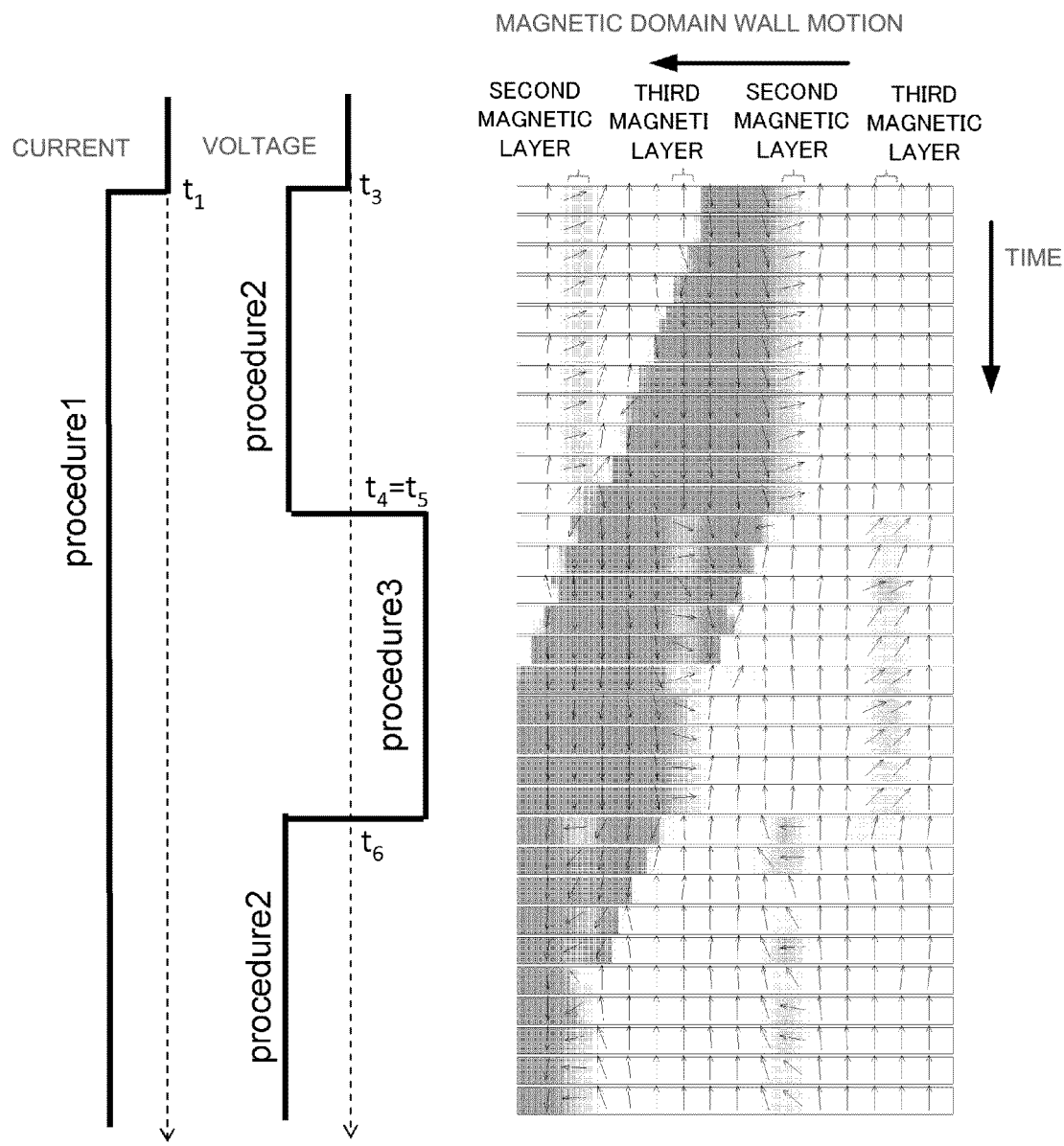
FIGS. 20A, 20B, and 20C are views showing a simulation result of a magnetic memory device of a second embodiment.

The simulating result about the magnetic domain motion in the laminated structure comprising two second magnetic layers 142 and two third magnetic layers 143 is shown in FIG. 20. The magnetization alignment shown in the top area in the FIG. 20C is initial state. Current is applied between the first electrode 11 and the second electrode 12 (executing the step 1) on the basis of the timing chart shown in FIG. 20A. Positive voltage and negative voltage are applied between the first electrode 11 and the third electrode 13 (executing the step 2 and the step 3) on the basis of the timing chart shown in FIG. 20B. The simulating result in FIG. 20C shows that the second magnetic layer prevents the magnetic domain wall motion during executing the step 1 and the step 2 simultaneously, and the third magnetic layer prevents the magnetic domain motion during executing the step 1 and the step 3 simultaneously.

Third Embodiment

A block comprising the magnetic memory devices being aligned, a writing section, and a reading section will be explained.

Figure 22:
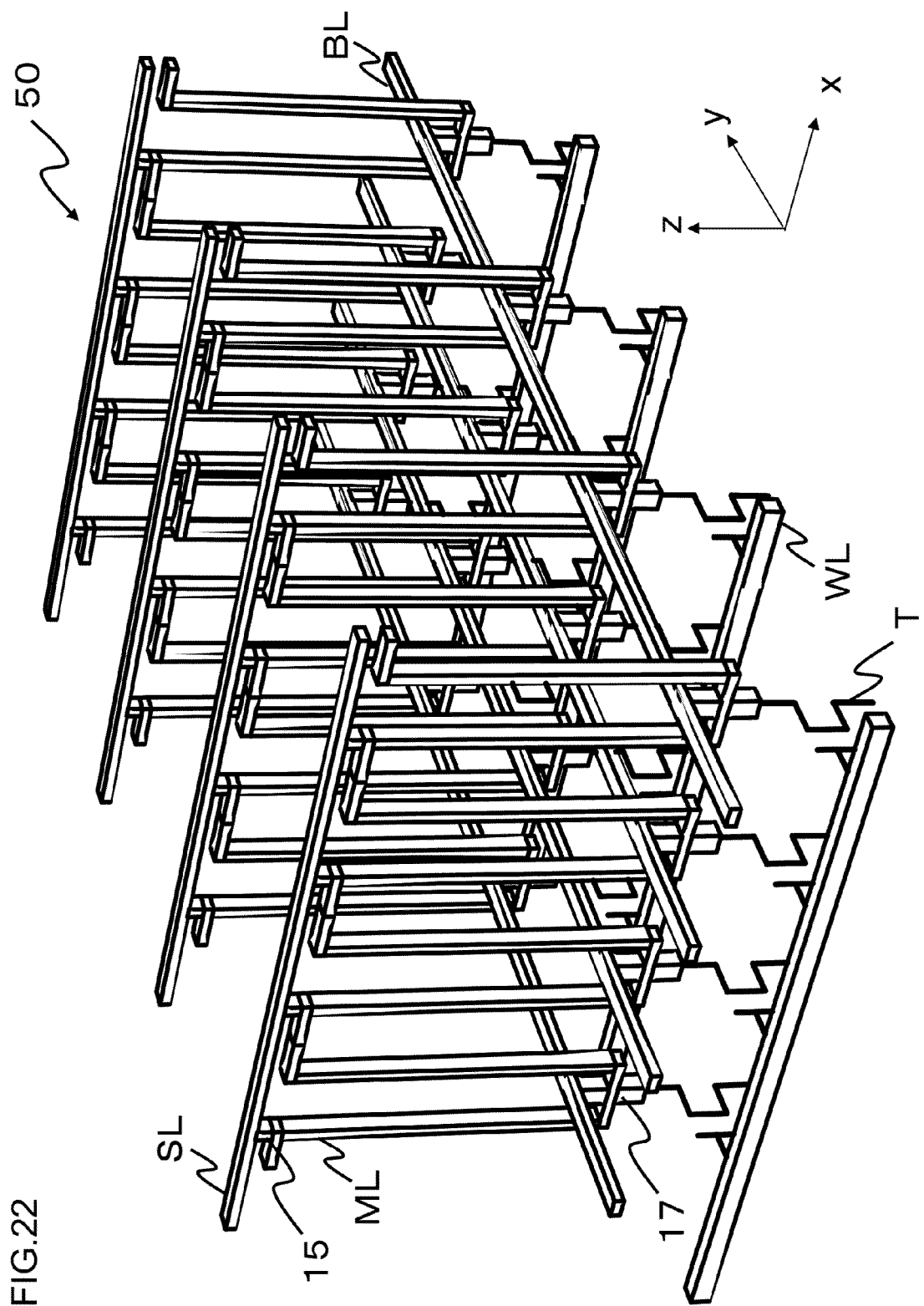
FIG. 22 is a schematic view showing a block of a third embodiment.

FIG. 22 is a schematic view of the block circuit of the third embodiment. FIG. 22 is a perspective view of the part of a block 50 of this embodiment. In the block of the third embodiment, a magnetic memory device R1 that the piezoelectric body is provided on the extending line connecting the first magnetic layer to the second magnetic layer is used for either of the magnetic memory devices explained in the first embodiment or the second embodiment and modified example related to the first embodiment or the second embodiment. The block of the third embodiment comprises the magnetic memory device R1, a switching device T (this device is comprised of a transistor, for example), and a memory track array MTA that is aligned like matrix state of m rows and n columns (m and n are positive integers). FIG. 2 shows the part of the memory track array MTA and the state that the memory track of 4 rows 4 columns is aligned.

A magnetic thin wire ML(i) (1≤i≤m) is comprised of each laminated structure, comprised of the n number of the magnetic memory devices R1 of the i th row (1≤i≤m), connected to the first magnetic layer being located at the edge of the laminated structure of neighboring magnetic memory device R1. the piezoelectric body 15 of the magnetic memory device R1 is provided between the magnetic thin wire ML(i) (i≤i≤m) and an electrode SL (for moving the magnetic domain wall) at every laminated structure. As mentioned above, in the case where the laminated structure of plural magnetic memory devices R1 is connected to the first magnetic layer, the electrode (the first electrode and the second electrode related to the first embodiment or the second embodiment and the modified example related to these embodiments) for applying current to the magnetic thin wire ML may not be provided at every magnetic memory device R1. Or the first electrode can be provided at one edge of the magnetic thin wire ML, the second electrode can be provided at the other edge of the magnetic thin wire ML. The magnetic thin wire may not be comprised of the magnetic memory devices R1. that each magnetic memory device R1 is connected each other. The first magnetic layer of each magnetic memory device R1 can be connected directly to peripheral circuit that will be mentioned.

The memory track array MTA comprises word lines WL (1)~WL (m) which are provided on each row, the electrode SL (1)~SL (m) like line shape, and bit lines BL (1)~BL (n) for reading information which are provide on each column. Plural word lines WL are aligned parallel each other, and the alignment of the electrode SL and the bit line is also same as the case of the word line WL. When viewing from z axis of FIG. 22, the electrode SL extends in the direction parallel to the word line WL, and the bit line BL extends in the direction crossing the electrode SL and the word line WL.

A gate of the switching device T of each memory track is connected to the word line corresponding to each row, one edge of the gate is connected to one edge of the reading section 17 of the magnetic memory device R in the memory track, and the other edge of the gate is grounded. The other edge of the reading section 17 of the magnetic memory device R1 in the memory track is connected to the bit line BL corresponding to the memory track mentioned above.

Figure 21:
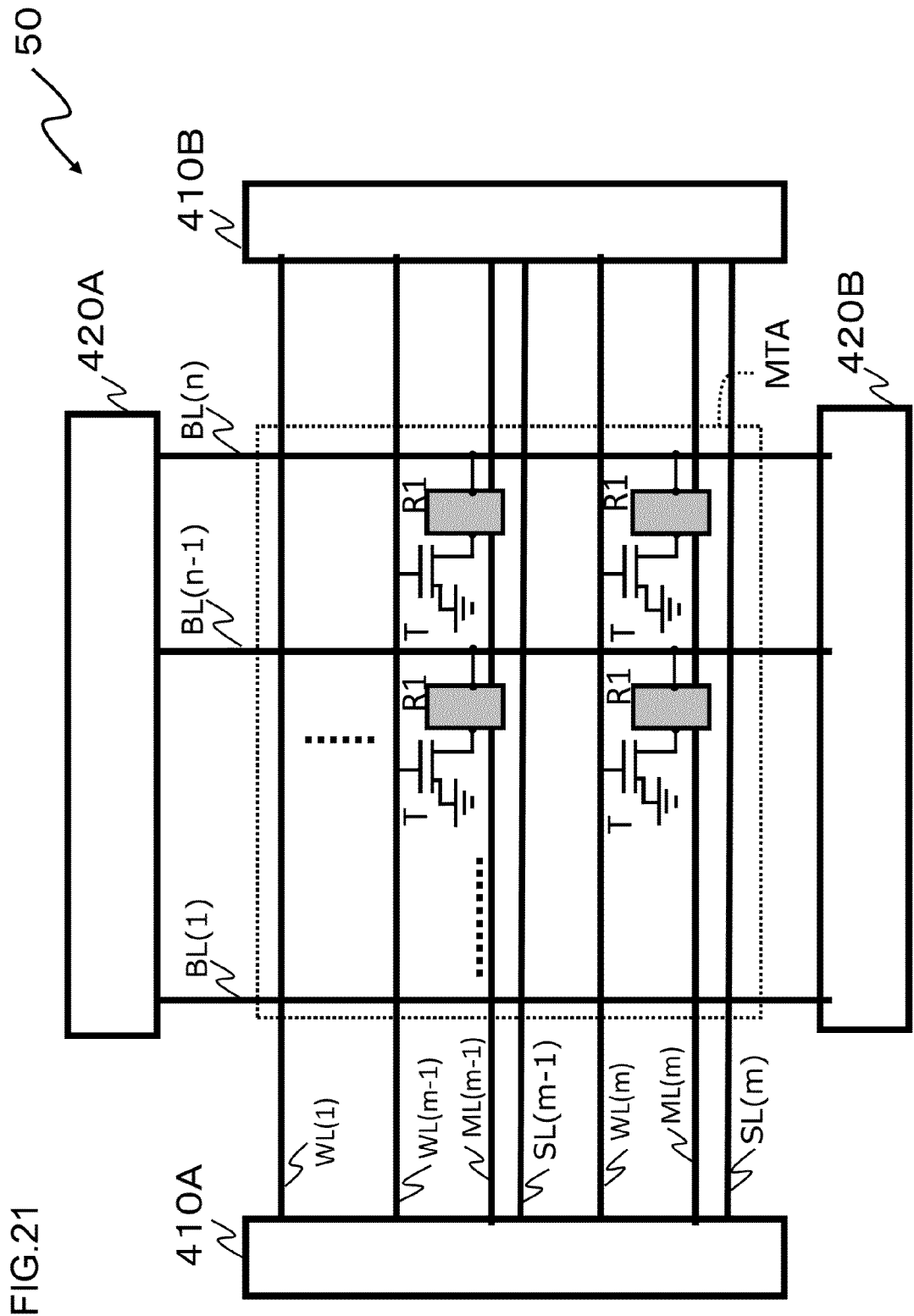
FIG. 21 is a view showing a block circuit of a third embodiment.

As shown in FIG. 21, the word lines WL (1)~WL (m), the magnetic thin wire ML (1)~ML (m), and the electrode SL (1)~SL (n) are connected to a decoder selecting each line and drive circuit 410A, 410B comprising a writing circuit or like. The bit lines BL (1)~BL (n) are connected to a decoder selecting each line and drive circuit 420A, 420B comprising a reading circuit or like. In FIG. 21 and FIG. 22, the writing section of the magnetic memory device R1 is omitted and not shown. One edge of the writing section can be connected to the switching device, not shown, for writing and selecting, and the other edge of the writing section can be a current source, not shown. The switching device for writing and the switching device for reading device can be used commonly for the writing selection. One reading section and one writing section can be provided for the plural memory tracks. In this case, this enables to make a high-density integration. In contrast, in the case where one reading section and one writing section are provided on each memory cell, the data transfer speed can be high.

The magnetic domain wall motion in the memory track of this embodiment will be explained. For example, as explained in the first embodiment, the magnetic memory device R1 comprises the laminated structure comprised of the first magnetic layer and the second magnetic layer. Address signal inputted from the external is decoded by the decoder in the drive circuit 410A, 410B, 420A, 420B, and the magnetic thin wire ML and the electrode SL corresponding to the address being decoded are selected, and the magnetic domain wall motion is executed (shift motion of data) by the step 1 applying current to this selected magnetic thin wire ML and the step 2 applying voltage to the electrode SL.

The step 1 and the step 2 are executed by using the timing explained in the first embodiment. In the case where the magnetic memory device R1 comprises the laminated structure comprised of the first magnetic layer, the second magnetic layer, and the third magnetic layer as explained in the third embodiment, the step 1, the step 2, and the step 3 are executed by using the timing explained in the second embodiment.

As mentioned above, by using this method of the magnetic domain wall motion in the memory track, the data position moves simultaneously in plural magnetic memory devices R1 included in the magnetic thin wire ML (i) comprising the magnetic thin wire ML (i) and existing on the same row of the memory track array MTA. Thus, data motion can be executed by one current source when plural magnetic memory devices are connected each other by sharing the first magnetic layer being provided on the edge of the magnetic memory device and the other first magnetic layer of the magnetic memory device. For this reason, electric power of the whole memory track array MTA can be reduced. The direction of the magnetic domain wall motion is same direction as the direction of electron current. Thus, the direction of the magnetic domain wall motion is opposite to the direction of electric current.

The writing to the memory track is executed when the decoder in the drive circuit 410A, 410B, 420A, 420B decodes the address signal inputted from the external part and the decoder chooses the word line WL corresponding to the address which is decoded and the switching device T is on. After that, data is written by applying current to the bit lie BL for reading information. Or data is written after moving the data reserved in the magnetic thin wire ML. For example, continuous data can be written fast when moving the distance corresponding to one bit and executing one bit data writing are executed alternately.

The data reserved in the memory track is read when the decoder in the drive circuit 410A, 410B, 420A, 420B decodes the address signal inputted from the external part and the decoder chooses the magnetic thin wire ML corresponding to the address being decoded and the data is shifted by use of above method so that the bit which is read is located on the reading section within bit column reserving the data in the memory track as the magnetization direction. After that, data is read when the decoder chooses the word line WL and sets the switching device T on and current is applied to the bit line BL for reading information. For example, continuous data can be read fast when moving the distance corresponding to one bit and executing one bit data reading are executed alternately. The direction of reading current can be positive or negative direction. The absolute value of the reading current is smaller than the absolute value of writing current. This enables the data reserved by the reading to prevent from inversion.

Figure 23:
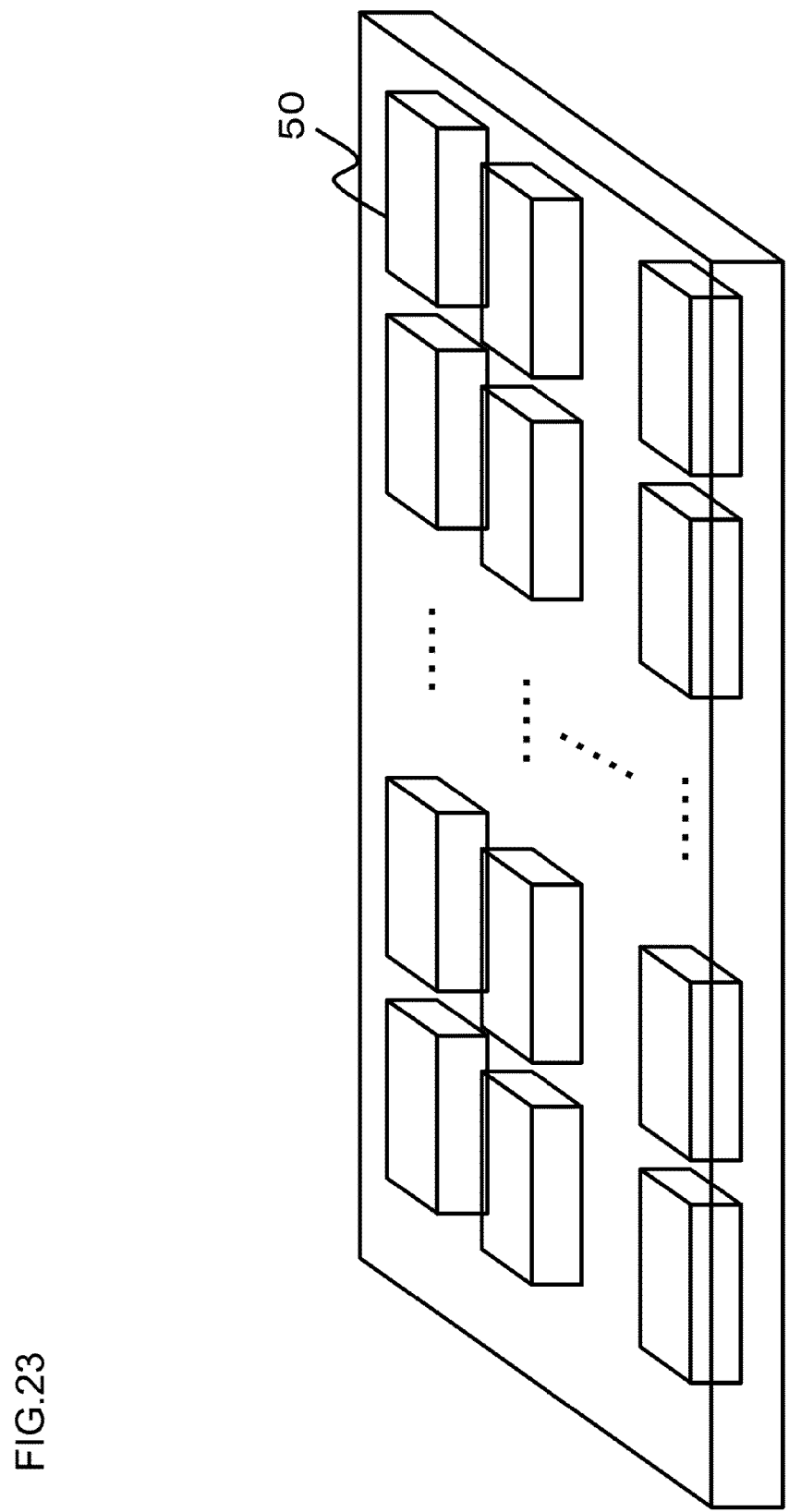
FIG. 23 is a schematic view showing memory tip of an embodiment.

A memory tip can be formed when plural blocks 50 are used. FIG. 23 shows a schematic view of the memory tip that plural blocks 50 are used. The memory tip can be formed by putting plural blocks on a tip.

Modified Example

Figure 24:
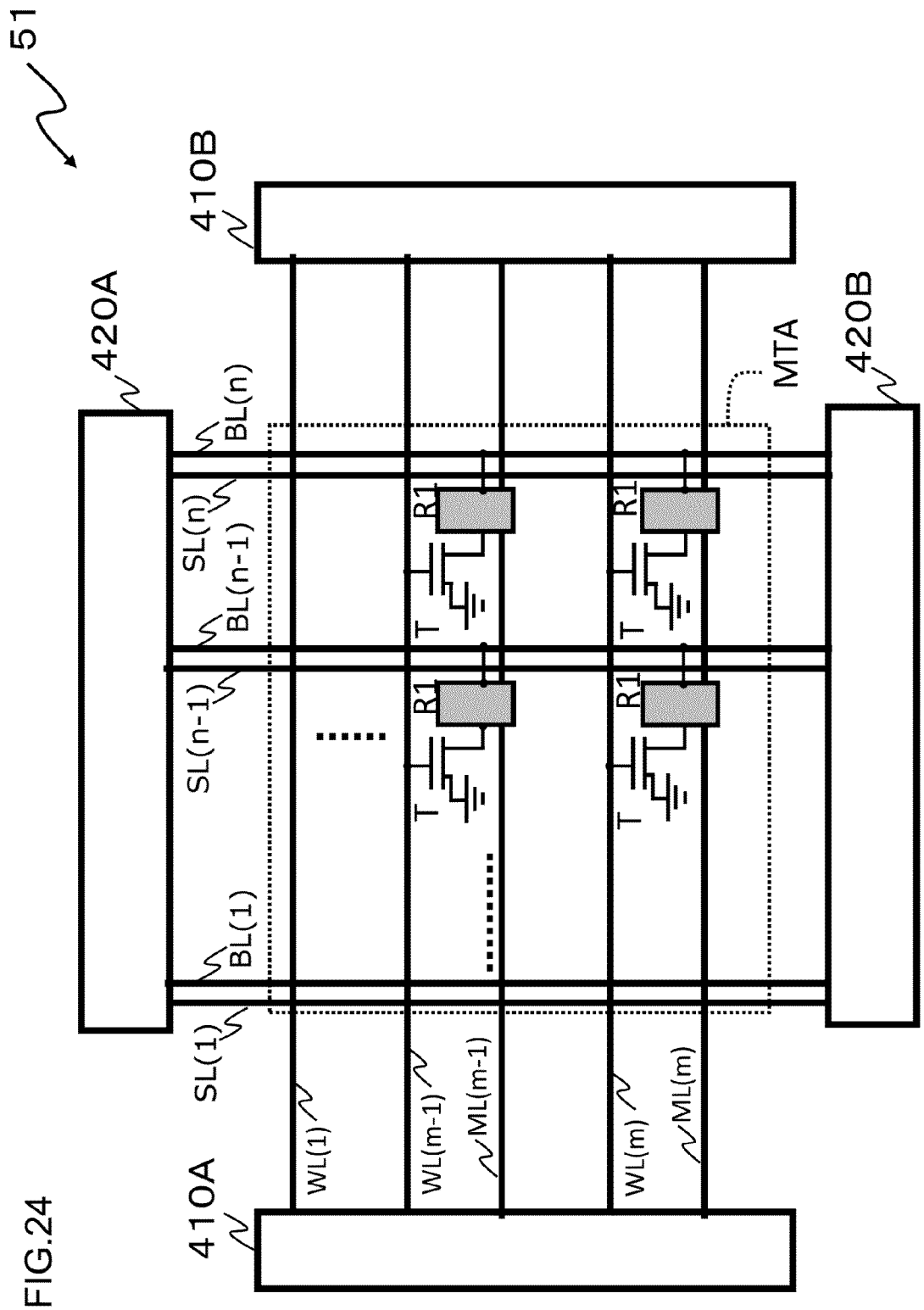
FIG. 24 is a view showing a block circuit of a first modified example of a third embodiment.
Figure 25:
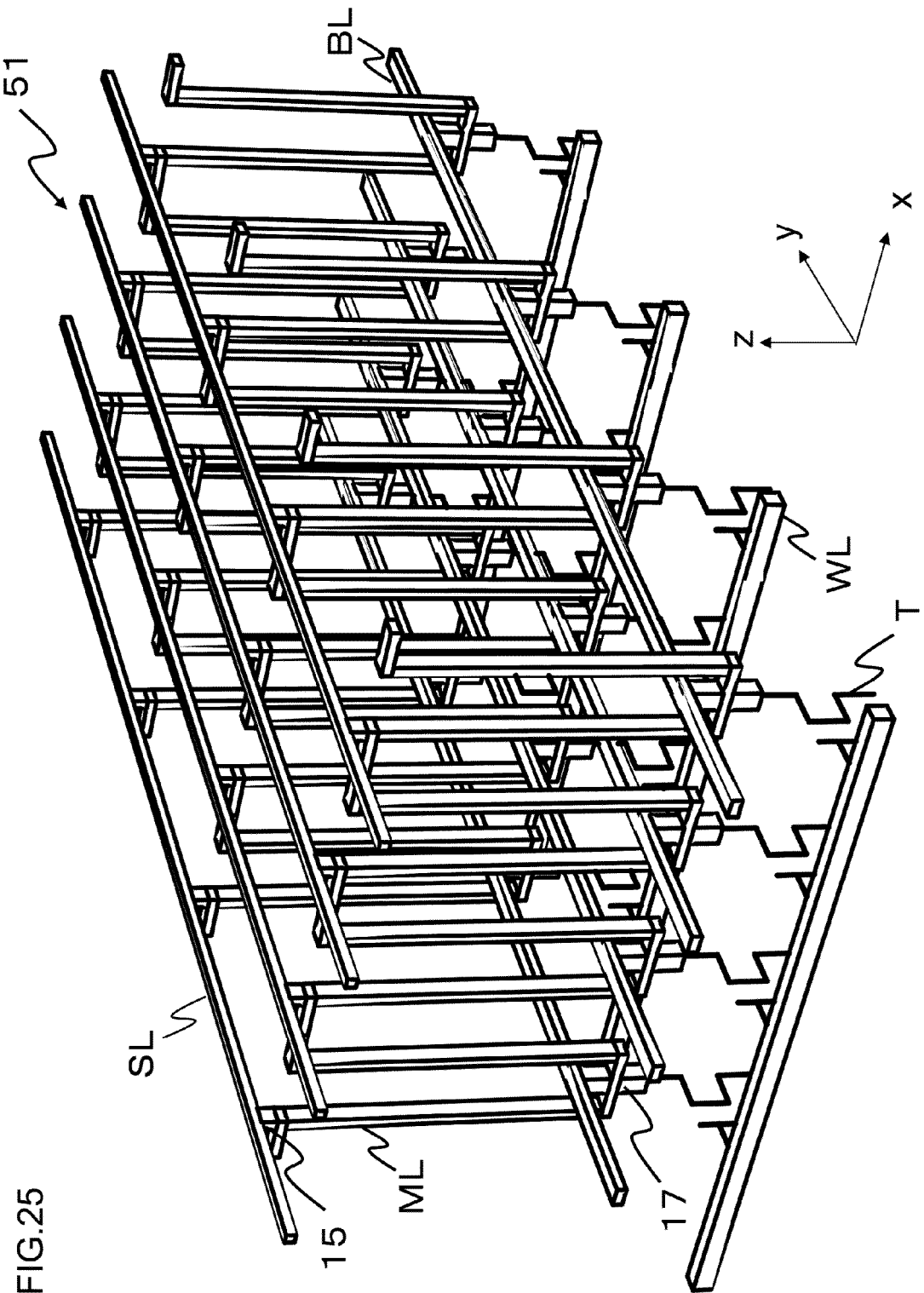
FIG. 25 is a schematic view showing a block of a first modified example of a third embodiment.

FIG. 24 is a schematic view of a block circuit of the first modified example of the third embodiment. FIG. 25 is a perspective view of a part of a block 51 of this modified example. In the case of the block 51, the extending direction of a line shape electrode SL for moving the magnetic domain wall (also called electrode SL) is different from that of the block 50 shown in FIG. 22. In the case of the block 50, the electrode SL extends in the direction parallel to the word line WL viewing from z-direction in FIG. 22. In the case of the block 51 of the first modified example the electrode SL extends in the direction (the direction crossing in the word line) parallel to the bit line BL for reading information viewing from z-direction in FIG. 25. The detail composition other than the electrode SL is same as the block 50, thus the detail explanation can be omitted.

The methods, the magnetic domain wall motion in the memory track of the block 51, writing data to the memory track, and reading data reserved in the memory track are same as the case of the method of the block 50.

Figure 26:
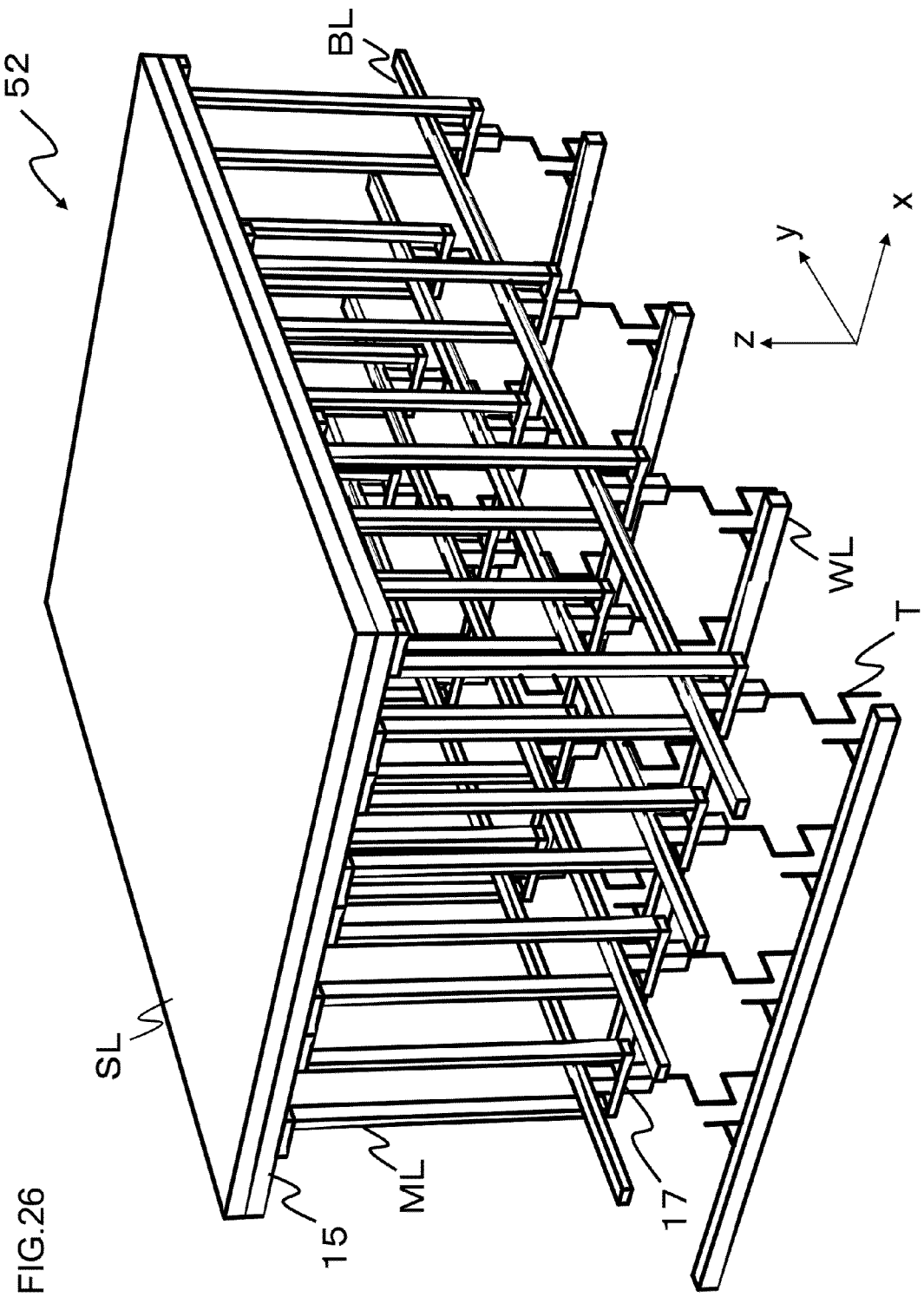
FIG. 26 is a schematic view showing a block of a second modified example of a third embodiment.

FIG. 26 is a perspective view of a part of a block 52 of a second modified of the third embodiment. In the block 52, the piezoelectric body 15 is shared with plural magnetic memory devices R1. As shown in FIG. 26, the piezoelectric body 15 is provided on the upper part of the laminated structure of plural magnetic memory devices R1. Moreover, a plane shape electrode 15 is provided on the upper part of the piezoelectric body 15. An insulator such as amorphous $SiO_2$, amorphous $Al_2O_3$ can be formed between the piezoelectric body 15 and the plane shape electrode 15, or between the laminated structure of the magnetic memory device R1 and the piezoelectric body 15. The detail composition other than the piezoelectric body 15 is same as the block 50, thus the detail explanation can be omitted.

In FIG. 26 an example that plane shape piezoelectric body 15 is provided on the upper part of the laminated structure of plural magnetic memory devices R1 that are aligned to be matrix. However, the piezoelectric body 15 and the electrode SL can be provided at every column or every row of the memory track array MTA. The piezoelectric body 15 can be provided at every magnetic memory device R1 and the electrode can be provided on (or sandwiching the insulator) plural piezoelectric bodies 15.

Applied strain can be added to plural laminated structures when voltage is applied to the piezoelectric body 15 by use of the electrode SL because in the case of the block 52 in FIG. 26 the piezoelectric body 15 is formed over the upper part of the laminated structure of plural magnetic memory devices R1. For example, the magnetic domain wall motion can be controlled every block when the piezoelectric body 15 is formed over the part of whole block 52.

The word line WL, the bit line for reading information, the switching device T of the memory track, and the drive circuit 410A, 410B, 420A, 420B are an example. These position, shape, or composition can be changed arbitrarily.

Fourth Embodiment

Figure 27:
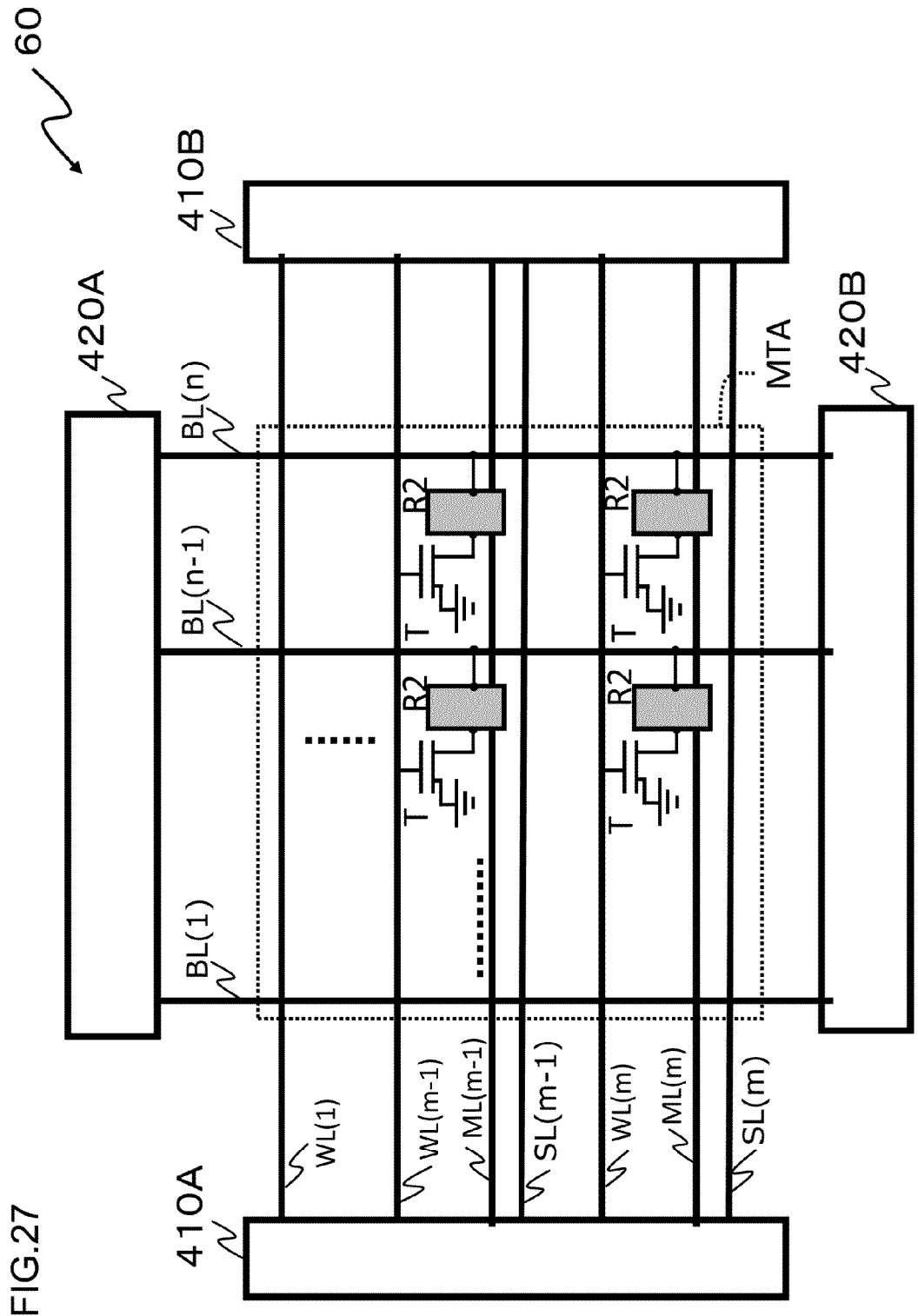
FIG. 27 is a view showing a block circuit of a fourth embodiment.
Figure 28:
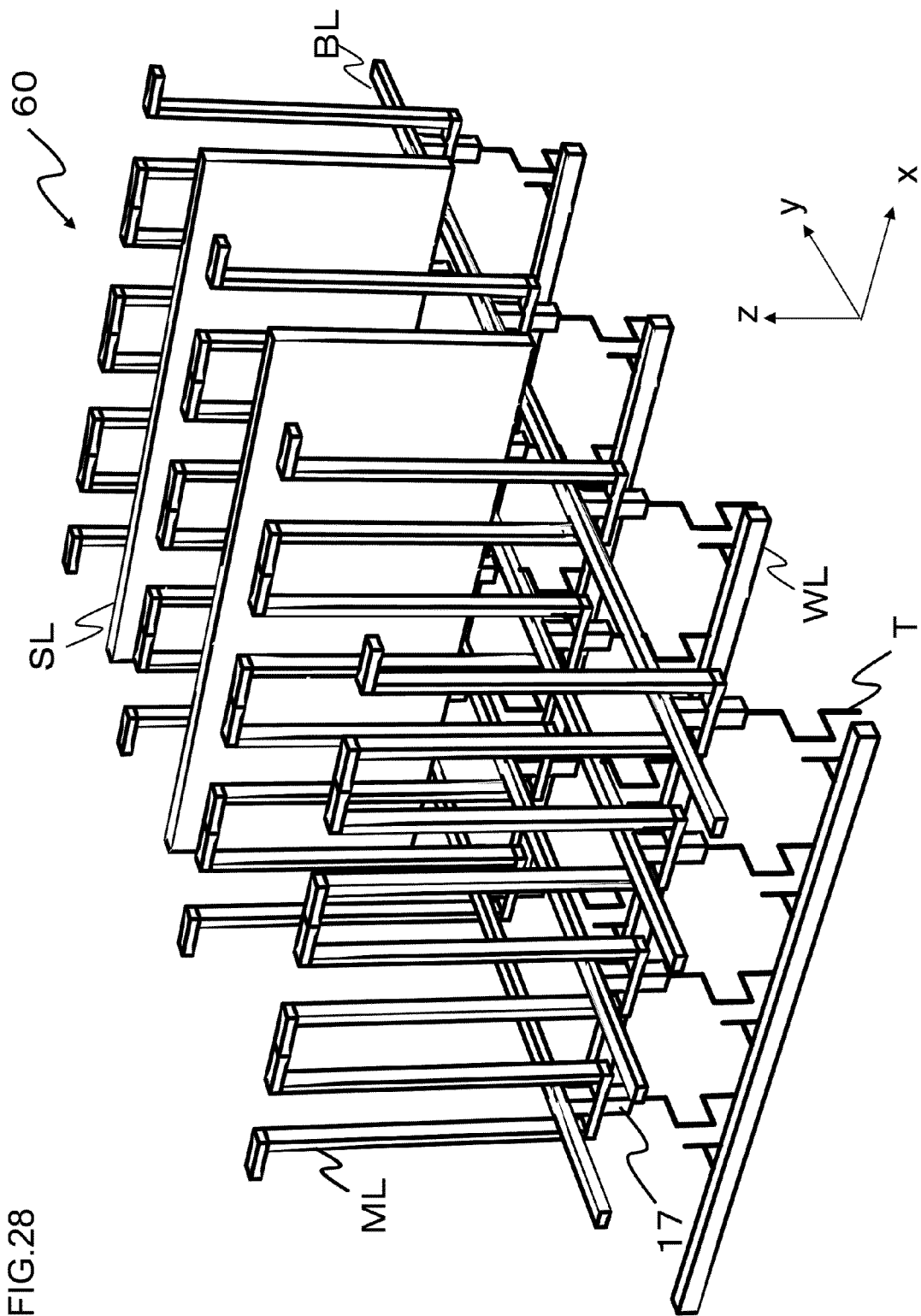
FIG. 28 is a schematic view showing a block of a fourth embodiment.

FIG. 27 is a schematic view of a block circuit of the fourth embodiment. FIG. 28 is a perspective view of a part of a block of the fourth embodiment. The magnetic memory device R2 is used for a block 60 of the fourth embodiment that the piezoelectric body surrounds the peripheral of the laminated structure of the magnetic memory device of the first embodiment, the second embodiment, or the modified example. The piezoelectric body is provided on peripheral of the laminated structure of the magnetic memory device R2 comprising the magnetic thin wire ML (not shown in FIG. 28). An insulator such as an amorphous $SiO_2$ or amorphous $Al_2O_3$ can be formed between the laminated structure of the magnetic memory device R2 and the piezoelectric body. This enables to keep insulation stably.

In the case where in FIG. 28 the magnetic thin wire ML is comprised of plural magnetic memory devices R2 being connected each other as mentioned in the third embodiment, the first electrode can be provided on one edge of the magnetic thin wire ML and the second electrode can be provided on the other edge of the magnetic thin wire ML for applying current to the magnetic thin wire ML. The first magnetic layer of each magnetic memory device R2 can be connected directly to peripheral circuit. The word line WL of the block 60, the bit line for reading information, the switching device T of the memory track, and the drive circuit 410A, 410B, 420A, 420B are same as the block 50 of the third embodiment. Thus, the detail explanation is omitted.

In the block 60 shown in FIG. 28, a plane shape electrode SL is provided between the magnetic thin wire ML and the other magnetic thin wire ML, and the plane shape electrode SL is aligned parallel to connecting direction of plural magnetic memory devices R2 of the magnetic thin wire ML. The shape of the electrode SL can be plane shape as shown in FIG.

28 or can be the other shape. In FIG. 28 the pair of electrode SL neighboring each other that sandwiching one magnetic thin wire ML However, plural plane shape electrodes SL can be provided to sandwich whole magnetic thin wire ML (i) (1≤i≤m).

For example, the plane shape electrode SL corresponds to the third electrode 13 in FIG. 15 and the fourth electrode 13a in FIG. 16. This plane shape electrode SL is a pair of electrodes SL neighboring each other and sandwiching one magnetic thin wire ML (i) and has same function as one line shape electrode SL in FIG. 22.

Plane shape electrode SL is connected to the drive circuit 410A, 410B via line. This enables to select the pair of electrode SL and apply electric field therein.

The magnetic domain wall motion in the memory track of this embodiment is same as the third embodiment. Thus, the decoder in the drive circuit 410A, 410B, 420A, 420B decodes the address signal inputted from the external part, and the decoder selects the magnetic thin wire ML and a pair of electrode SL corresponding to the address which is decoded, and a step 1 that current is applied to the magnetic thin wire ML which is selected and a step 2 that voltage is applied to the pair of electrode SL are executed. These steps enable the magnetic domain wall to move (data shift motion). The step 1 and the step 2 are executed at the timing explained in the first embodiment. In the case where the magnetic memory device R2 comprises the laminated structure of the first magnetic layer, the second magnetic layer, and the third magnetic layer as explained in the second embodiment, the step 1 and the step 2 are executed at the timing of the second embodiment.

Writing data to the memory track and reading data reserved in the memory track are same as the method of the third embodiment.

As mentioned above, data shift motion can be also executed by one current source in the fourth embodiment when the first magnetic layer being located on the edge of the magnetic memory device shares the other magnetic memory device and plural magnetic memory devices are connected. For this reason, power consumption of whole the memory track array MTA can be controlled. Thus, the direction of the magnetic domain wall motion is opposite to the direction of electric current.

Large capacity memory tip can be fabricated as explained in the third embodiment by using plural blocks in the fourth embodiment.

Modified Example

Figure 29:
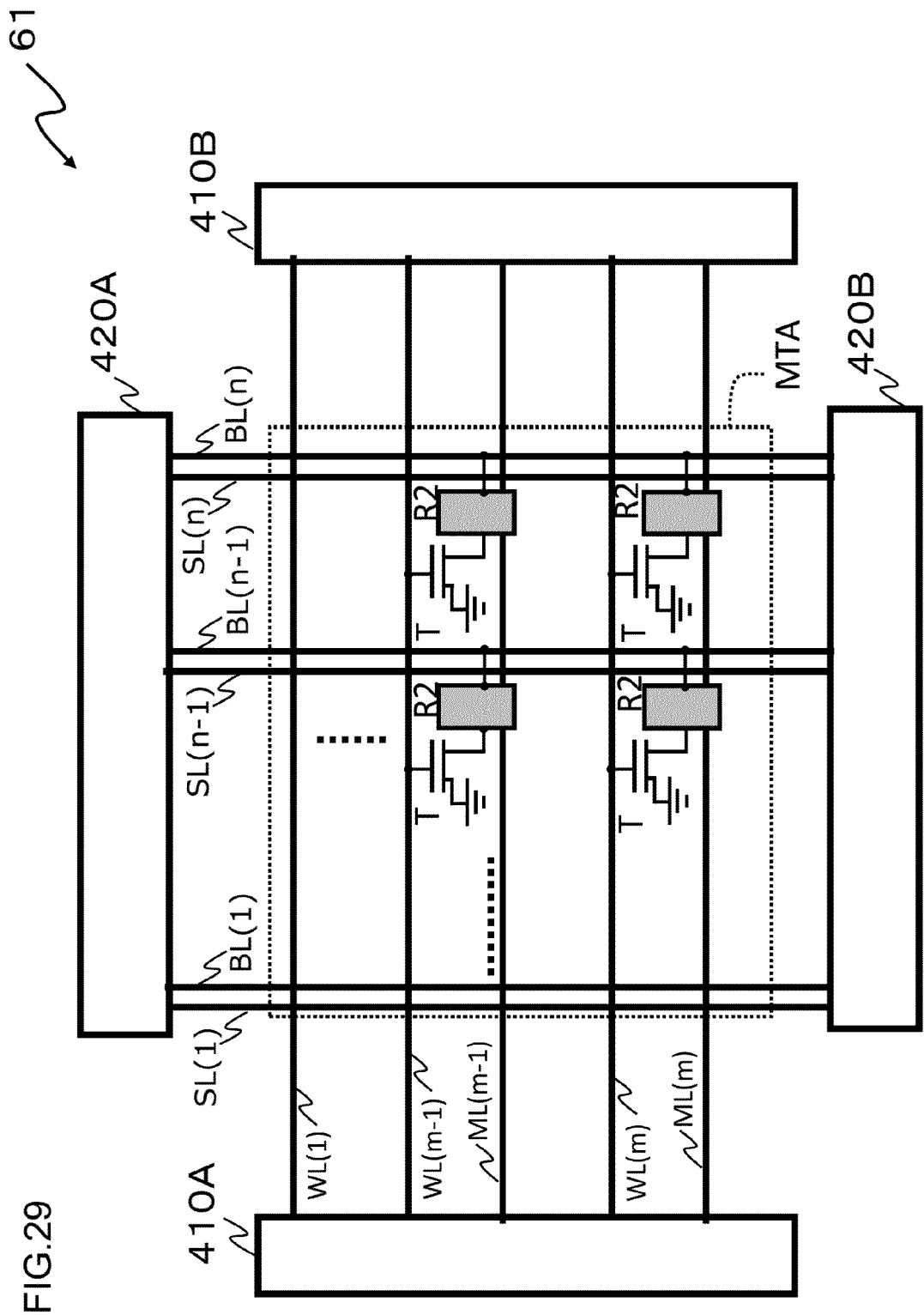
FIG. 29 is a block circuit showing a first modified example of a third embodiment.
Figure 30:
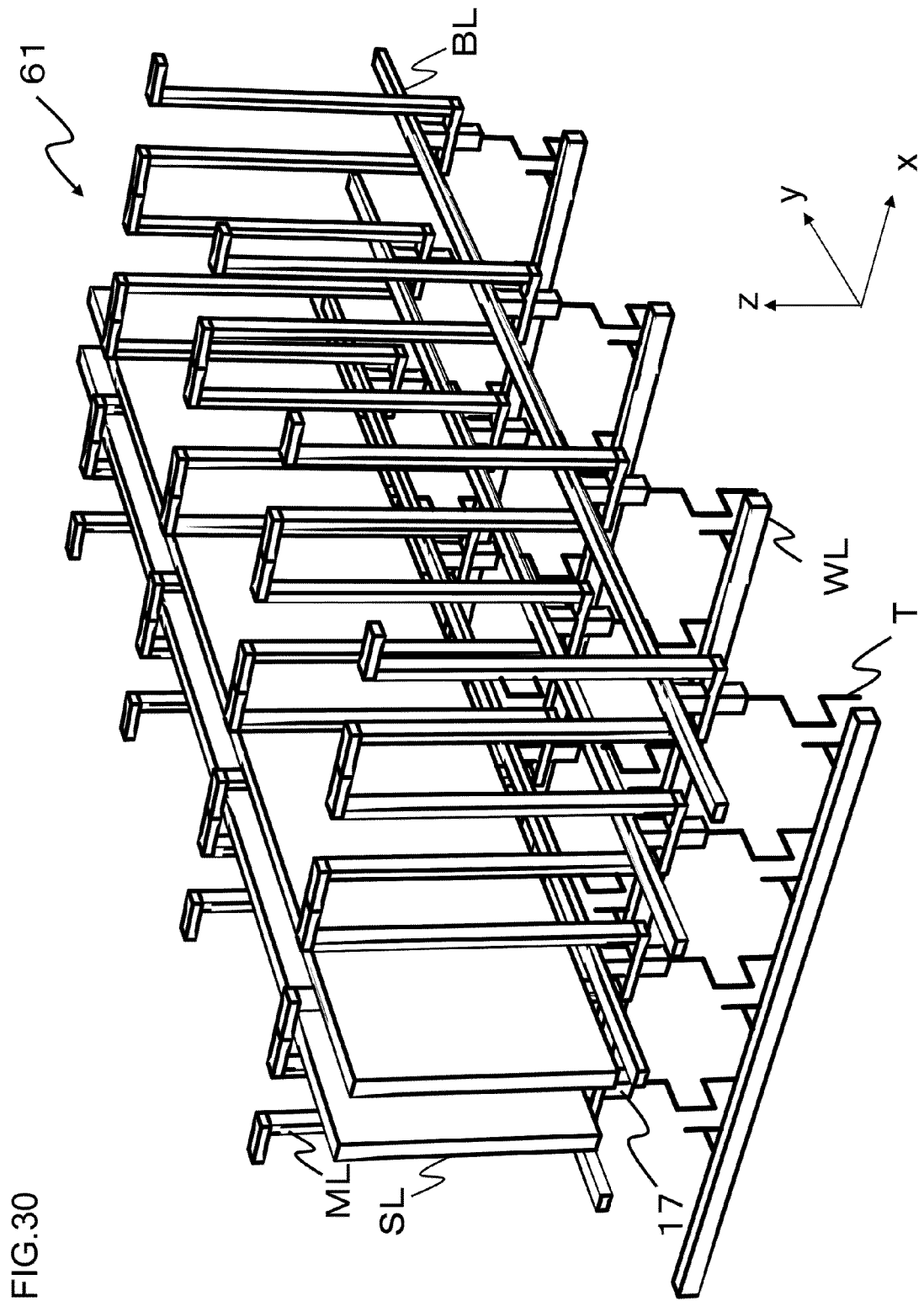
FIG. 30 is a schematic view showing a first modified example of a third embodiment.

FIG. 29 is a schematic view of a block circuit of the first modified example of the fourth embodiment. FIG. 30 is a perspective view of a part of a block 61 of the modified example. In the fourth embodiment, the extending direction of plane shape electrode SL can be also changed same as the first modified example of the third embodiment. In the block 61 of the first modified example shown in FIG. 30, the electrode SL extends in the direction parallel to the bit line BL for reading information (the direction crossing in the word line WL). A pair of electrodes SL is provided in the block 61 every laminated structure that the first magnetic layer, the second magnetic layer, and the third magnetic layer are laminated in z-direction of the magnetic memory device R2.

In FIG. 30, electrode SL for one laminated structure is only shown. However, plural electrodes SL can be provided to sandwich each laminated structure. The composition other than the electrode SL is same as the case of the block 60, thus the detail explanation is omitted.

The magnetic domain wall motion in the memory track of the block 61, writing data to the memory track, and reading data reserved in the memory track are same as the case of the block 60.

Figure 31:
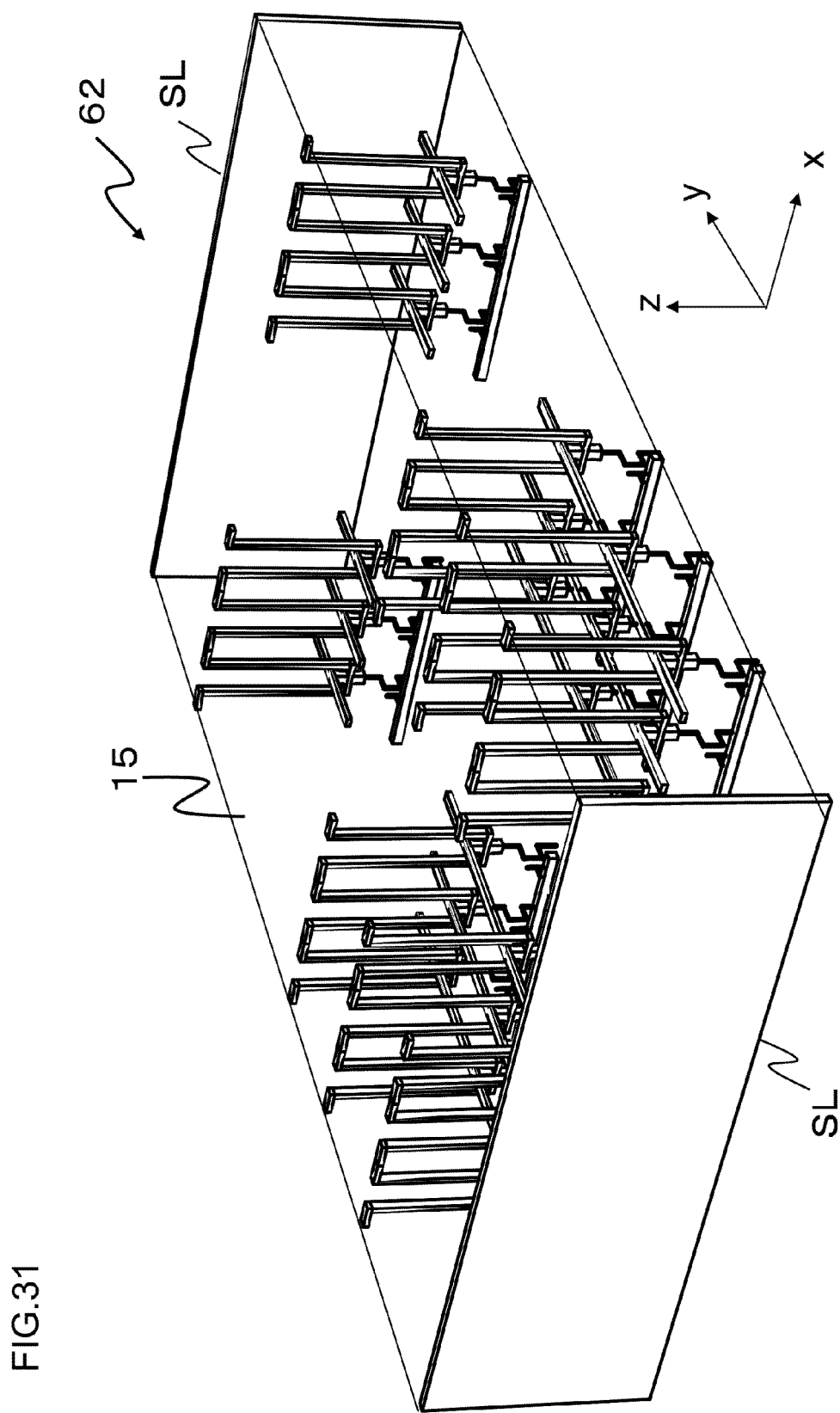
FIG. 31 is a schematic view showing a second modified example of a third embodiment.

FIG. 31 is a perspective view of a block 62 of a second modified example of the fourth embodiment. In the block 62 of the second modified example of the fourth embodiment, the pair of electrodes SL is provided to sandwich the laminated structure of whole memory track included in the block.

In the case of the block 62 shown in FIG. 31, when a voltage is applied to the piezoelectric body 15 being sandwiched by a pair of electrodes SL, a strain can be applied to the laminated structure being surrounded by the piezoelectric body 15 and the magnetic domain wall motion can be controlled every block.

The pair of plane shape electrodes SL can be provided every plural column of the magnetic thin wire ML In this case, the number of the electrodes SL shown in FIG. 21 is smaller than the m number of the electrodes SL. This structure enables to decrease the area ratio of the electrode SL occupied in whole memory track. Thus, this structure has advantage for high integration. On the other hand, for example, as shown in FIG. 28, in the case where the pair of electrodes SL is provided to sandwich one magnetic thin wire SL, selecting the magnetic thin wire executing the step 1 and the step 2 simultaneously becomes easier when the magnetic domain wall position is moved.

In the second modified example of the fourth embodiment, an example that the electrode SL is aligned parallel to the connecting direction of plural magnetic memory device R2 in the magnetic thin wire. However, the first modified example and the second modified example can be combined. The electrode SL can be aligned in direction orthogonal to connecting direction of plural magnetic memory devices R2 in the magnetic thin wire ML. This enables a pair of plane shape electrode SL to be provided every plural rows of the magnetic thin wire ML (i). The position that the electrode SL is provided toward the piezoelectric body 15 can be changed arbitrarily if electric field can be applied to the piezoelectric body 15.

The word line WL, the bit line for reading information, the switching device T of the memory track, and the drive circuit 410A, 410B, 420A, 420B shown in this embodiment and the modified example related to this embodiment are an example. These position, shape, or composition can be changed arbitrarily.

The embodiments related to this invention are explained by using concrete examples. However, this invention is not limited to these embodiments. For example, concrete size of each element comprising the magnetic memory device, materials, electrodes, passivation, shape or composition related to insulating structure can be included in this invention if ordinary skill person execute this invention same as this embodiments by selecting ordinary skill arbitrarily and can gain same effect from doing that. For example, for each magnetic layer comprising a magnetic element, the shape and the size are not needed to be same, so the shape and the size can be fabricated as different each other. Each element of antiferromagnetic layer, intermediate layer, and insulating layer or like comprising the magnetic memory device can be formed as single layer or can be multiple layers that plural layers are laminated. The modified example explained in each embodiment can be applied to other embodiments or plural modified examples can be combined each other.

In basis of the magnetic memory devices or the magnetic recording device mentioned above as the embodiment of this invention, whole magnetic memory device or recording device that ordinary skill person can fabricate and change and execute arbitrarily can be included in this invention if the ordinary skill person executes within the aim of this invention.

The word "perpendicular" includes gap generated from a perpendicular that is derived from the variation of fabricating process. In the same way, the meaning of "parallel", "flat" are different from the meaning of absolute parallel or absolute flat.

While certain the embodiment of the invention has been described, these embodiments have been presented by way of example only, and are not intended to limit the scope of the embodiment of the inventions. Indeed, the novel elements and apparatuses described herein may be embodied in a variety of other forms; furthermore, various omissions, substitutions and changes in the form of the methods and systems described herein may be made without departing from the spirit of the embodiment of the invention. The accompanying claims and their equivalents are intended to cover such forms or modifications as would fall within the scope and spirit of the embodiment of the invention.

What is claimed is:

1. A magnetic memory device comprising:
   plural laminated structures, each laminated structure comprising; plural first magnetic layers; and a second magnetic layer comprising different composition elements from that of the first magnetic layer and being provided between plural first magnetic layers;
   a piezoelectric body provided to surround the plural laminated structures; and
   a first electrode and a second electrode applying voltage to the piezoelectric body.

2. A magnetic memory system comprising a plurality of the magnetic memory devices according to claim 1, the magnetic memory devices being aligned in a row direction or in a column direction.

3. The magnetic memory device according to claim 1, wherein
   the first electrode and the second electrode are extended parallel to a row direction or a column direction.

4. The magnetic memory device according to claim 1, wherein
   a sign of a magnetostriction constant of the first magnetic layers is different from a sign of a magnetostriction constant of the second magnetic layer, or an absolute value of the magnetostriction constant of the first magnetic layers is smaller than an absolute value of the magnetostriction constant of the second magnetic layer.

5. The magnetic memory device according to claim 1, wherein:
   the first magnetic layer and the second magnetic layer comprising GdFe, GdCo, GdFeCo, TbFe, TbCo, TbFeCo, GdTbFe, GdTbCo, DyFe, DyCo, or DyFeCo.

6. A magnetic memory device comprising:
   plural laminated structures arranged in a row direction and a column direction, each laminated structure comprising: plural first magnetic layers; and a second magnetic layer comprising different composition elements from that of the first magnetic layer and being provided between plural first magnetic layers;
   a piezoelectric body provided to surround the plural laminated structures; and
   a first electrode and a second electrode applying voltage to the piezoelectric body.

7. The magnetic memory device according to claim 6, wherein
   the first electrode and the second electrode are extended parallel to a row direction or a column direction.

8. The magnetic memory device according to claim 6, wherein
   a sign of a magnetostriction constant of the first magnetic layers is different from a sign of a magnetostriction constant of the second magnetic layer, or an absolute value of the magnetostriction constant of the first magnetic layers is smaller than an absolute value of the magnetostriction constant of the second magnetic layer.

9. The magnetic memory device according to claim 6, wherein:
   the first magnetic layer and the second magnetic layer comprising GdFe, GdCo, GdFeCo, TbFe, TbCo, TbFeCo, GdTbFe, GdTbCo, DyFe, DyCo, or DyFeCo.

10. A method of magnetic domain wall motion of the magnetic memory device of claim 1, comprising:
    a first step applying a current between the first electrode and the second electrode for a first time duration; and
    a second step applying a voltage to the piezoelectric body for a second time duration, wherein
    a completing time of the second step is after a completing time of the first time.

* * * * *